(12) United States Patent
Akram et al.

(10) Patent No.: US 7,109,068 B2
(45) Date of Patent: Sep. 19, 2006

(54) THROUGH-SUBSTRATE INTERCONNECT FABRICATION METHODS

(75) Inventors: Salman Akram, Boise, ID (US); Kyle K. Kirby, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 11/138,544

(22) Filed: May 26, 2005

(65) Prior Publication Data
US 2006/0046468 A1    Mar. 2, 2006

Related U.S. Application Data

(60) Provisional application No. 60/606,355, filed on Aug. 31, 2004.

(51) Int. Cl.
    *H01L 21/82* (2006.01)
(52) U.S. Cl. .................................. 438/128; 257/E21.59
(58) Field of Classification Search ................. 438/128; 257/774
    See application file for complete search history.

(56) References Cited

U.S. PATENT DOCUMENTS

| | | |
|---|---|---|
| 4,445,978 A | 5/1984 | Whartenby et al. |
| 4,806,111 A | 2/1989 | Nishi et al. |
| 5,063,177 A | 11/1991 | Geller et al. |
| 5,166,097 A | 11/1992 | Tanielian |
| 5,229,647 A | 7/1993 | Gnadinger |
| 5,236,551 A * | 8/1993 | Pan .............................. 216/19 |
| 5,269,880 A | 12/1993 | Jolly et al. |
| 5,420,520 A | 5/1995 | Anschel et al. |
| 5,426,072 A | 6/1995 | Finnila |
| 5,438,212 A | 8/1995 | Okaniwa |
| 5,483,741 A | 1/1996 | Akram et al. |
| 5,495,667 A | 3/1996 | Farnworth et al. |
| 5,528,080 A | 6/1996 | Goldstein |
| 5,541,525 A | 7/1996 | Wood et al. |
| 5,559,444 A | 9/1996 | Farnworth et al. |

(Continued)

OTHER PUBLICATIONS

Lee et al., Laser Created Silicon Vias for Stacking Dies in MCMs, EMT Symposium, 1991, Tampa, Florida, pp. 262, 263, 265.

(Continued)

*Primary Examiner*—W. David Coleman
*Assistant Examiner*—Jarret J. Stark
(74) *Attorney, Agent, or Firm*—TraskBritt

(57) ABSTRACT

A method for forming a conductive via or through-wafer interconnect (TWI) in a semiconductive substrate for use as a contact card, test connector, semiconductor package interposer, or die interconnect includes the acts of (a) forming an oxide or nitride layer on both sides of the substrate, (b) forming a precursor aperture in the substrate at a desired location by laser or etch, (c) further etching the precursor aperture to enlarge and shape at least a portion thereof with undercut portions below an initial etch mask layer, (d) lining the aperture with a passivation material, (e) filling the aperture with a conductive material, and (f) thinning one or both surfaces of the substrate to achieve desired stand-off distances of the opposed via ends. The shaped via aperture has an enlarged central portion, and one or more end portions which taper to smaller end surfaces. The one or more via end portions may be trapezoidal in shape. A further rounding etch act following the shaping etch will result in a rounded, i.e., frustoconical, shape. The shape is conducive to improved solder ball/bump attachment, and enables forming vias of very small diameter and pitch.

78 Claims, 12 Drawing Sheets

U.S. PATENT DOCUMENTS

| | | |
|---|---|---|
| 5,592,736 A | 1/1997 | Akram et al. |
| 5,607,818 A | 3/1997 | Akram et al. |
| 5,686,317 A | 11/1997 | Akram et al. |
| 5,796,264 A | 8/1998 | Farnworth et al. |
| 5,841,196 A | 11/1998 | Gupta et al. |
| 6,013,948 A | 1/2000 | Akram et al. |
| 6,018,196 A | 1/2000 | Noddin |
| 6,022,797 A | 2/2000 | Ogasawara et al. |
| 6,054,377 A | 4/2000 | Filipiak et al. |
| 6,080,664 A | 6/2000 | Huang et al. |
| 6,114,240 A * | 9/2000 | Akram et al. ............ 438/667 |
| 6,214,716 B1 | 4/2001 | Akram |
| 6,221,769 B1 | 4/2001 | Dhong et al. |
| 6,355,181 B1 | 3/2002 | McQuarrie |
| 6,400,172 B1 * | 6/2002 | Akram et al. ............ 324/765 |
| 6,410,976 B1 | 6/2002 | Ahn |
| 6,420,209 B1 | 7/2002 | Siniaguine |
| 6,458,696 B1 | 10/2002 | Gross |
| 6,479,382 B1 | 11/2002 | Naem |
| 6,541,280 B1 | 4/2003 | Kaushik et al. |
| 6,620,731 B1 | 9/2003 | Farnworth et al. |
| 6,667,551 B1 | 12/2003 | Hanaoka et al. |
| 6,770,923 B1 | 8/2004 | Nguyen et al. |
| 6,821,877 B1 | 11/2004 | Han |
| 6,841,883 B1 | 1/2005 | Farnworth et al. |
| 6,846,725 B1 | 1/2005 | Nagarajan et al. |
| 6,979,652 B1 * | 12/2005 | Khan et al. ............ 438/700 |
| 2002/0148807 A1 * | 10/2002 | Zhao et al. ............ 216/2 |
| 2005/0006768 A1 | 1/2005 | Narasimhan et al. |
| 2005/0199973 A1 * | 9/2005 | Benzel et al. ............ 257/417 |

OTHER PUBLICATIONS

Chu et al., Laser Micromachining of Through Via Interconnects in Active Die for 3-D Multichip Module, IEEE/CMPT Int'l EMT Symposium, 1995, pp. 120-126.

* cited by examiner

THROUGH-SUBSTRATE INTERCONNECT FABRICATION METHODS

CROSS-REFERENCE TO RELATED APPLICATIONS

This application claims the benefit of Provisional Application Ser. No. 60/606,355, filed on Aug. 31, 2004.

BACKGROUND OF THE INVENTION

1. Field of the Invention

The present invention relates to methods for forming conductive vias and electrical contact terminals for substrates, such as semiconductor wafers or other bulk substrates or portions thereof, for use as contact cards, test carriers, package interposers and other substrates, and the like, and the resulting structures and assemblies.

2. State of the Art

Semiconductor wafers and portions thereof are used for substrates for contact cards, test carriers, package substrates, and for other purposes. Typically, the portion of such a substrate has circuits formed on one or both sides for the mounting of one or more semiconductor dice thereon, for making electrical contact to active circuitry of semiconductor dice of a wafer to be tested, and for other purposes. Some portions of substrates, including semiconductor wafers, may have vias extending therethrough filled with conductive material for forming interconnects (commonly known as a through wafer interconnect, or TWI) for connecting circuitry on one side of a portion of the semiconductor wafer to circuitry on the other side thereof, or to external circuitry.

As used herein, a "via" refers to a hole or aperture having conductive material or a conductive member therein which extends through a substrate. The via may be used for electrically connecting a semiconductor device, a component, apparatus, or circuitry on one side of the substrate to a semiconductor device, a component, apparatus, or circuitry on the other side of the substrate. A via may typically be formed in a variety of substrates for a variety of uses, such as interposers for single die packages, interconnects for multi-die packages, and contact probe cards for temporarily connecting semiconductor dice to a test apparatus, for example. For example, a test apparatus is typically configured for temporary simultaneous connection of bond pads of a semiconductor die on a full or partial wafer to the test apparatus. A pattern of conductive vias passing through a substrate employed as a test interposer are designed on one side to match the bond pad patterns of the semiconductor dice on the wafer or portion of a wafer, and on the other side to be connected to the test apparatus.

Where a via is to be formed through a semiconductive material such as silicon, a prior method for constructing a via includes a first or precursor hole being typically formed by a so-called "trepan" process, whereby a very small router or drill is rotated while being moved radially to create the precursor hole. The precursor hole is larger in diameter than the desired completed via to be formed. Following precursor hole formation, an insulation (dielectric) layer is formed in the hole by either forming a thin silicon oxide layer on the hole's surface by exposure to an oxidizing atmosphere or by coating the hole with an insulative polymeric material after oxidizing the hole. When a polymeric insulative material coating is desired, a suitable polymer such as Parylene™ resin may be vapor deposited over the substrate including within each precursor hole while applying a negative pressure, i.e., vacuum, to the opposite end of the hole. Oxidation of the hole surfaces is required because adhesion of polymer to silicon is relatively poor while adhesion to the oxide is much improved. The insulative polymeric material is drawn into each primary hole to fill the hole. The polymer is then cured, and a small diameter via hole is drilled (by percussion drill or laser) or otherwise formed in the hardened insulative polymeric material. The via hole is then filled with a conductive material, typically a metal, metal alloy, or metal-containing material to provide a conductive path between the opposed surfaces of the substrate. The conductive material of the via is insulated from the substrate itself by the insulative polymeric material. In this method of forming vias, dense spacing of vias is difficult to achieve.

Another prior art method for forming vias in a semiconductor substrate is illustrated in drawing FIG. 1A through FIG. 1F. Such a method is also generally illustrated in U.S. Pat. No. 5,166,097 to Tanielian, U.S. Pat. No. 5,063,177 to Geller et al., and U.S. Pat. No. 6,400,172 to Akram et al. Illustrated in drawing FIG. 1A, a silicon wafer 2 is provided with a thin layer 4 of silicon dioxide on at least both major, opposing surfaces. A pattern 6 is then formed on the wafer 2 and a mask layer 8 is formed to prevent etching in non-via areas, as shown in drawing FIG. 1B. In drawing FIG. 1C, etchant has been applied to both major surfaces to form feedthroughs 10 which meet in the middle of the wafer. The wafer 2 is shown with the mask layer 8 removed. A dielectric layer 12 is then formed over the wafer surfaces including the feedthrough side walls, as shown in drawing FIG. 1D. In the next act, illustrated in drawing FIG. 1E, a metal layer 14 is formed over the dielectric layer 12. The wafer is illustrated in drawing FIG. 1F as having a conductive material (shown in broken lines) placed in the feedthroughs 10 to complete the conductive vias 16. It is noted that in order to isolate each via, the metal layer 14 must be configured to cover the feedthrough surfaces only, or be subsequently removed from the outer surfaces of the via and wafer.

As illustrated in U.S. Pat. No. 5,166,097 to Tanielian, in U.S. Pat. No. 5,063,177 to Geller et al., and in U.S. Pat. No. 6,400,172 to Akram et al., the cross-sectional shape of the feedthrough 10 and via 16 is generally that of an hour-glass, with the greatest cross-sectional dimension(s) located at the wafer surfaces. Illustrated in drawing FIG. 2 is an enlarged portion of drawing FIG. 1E. In a preferred embodiment of Tanielian, each half-via 16A, 16B is pyramidal in shape, with a side angle 18 of about 54.7 degrees to the plane of wafer 2. Thus, in this embodiment of Tanielian the minimal ratio of via dimension 30 (of surface 22) to total via depth 32 (substrate thickness) will be in a range of about 0.45 to about 0.52, which is the reciprocal of the via's aspect ratio. As electronic components are becoming increasingly dense, it is necessary to decrease the lateral size or diameter as well as spacing or pitch of TWIs for increased TWI density. To achieve the desired feature densities for TWIs in future electronic components, the aspect ratio of depth 32 to dimension 30 must be considerably larger than about 2.0 for a given substrate thickness.

Illustrated in drawing FIG. 3 is an interposer wherein a method for attaching solder balls/bumps to a via 16 requires that one or both wafer surfaces are mechanically or chemically-mechanically thinned to produce surfaces 34 defining thinned wafer 2. The removal of material from wafer 2 results in exposure of the side surfaces 24 of the via 16, to which a solder bump/ball 20 is wetted and bonded, and exposure of the substrate surface 34. Reflow of a bump/ball 20 results in solder extending about side surfaces 24 of the via 16. Inasmuch as the outer surfaces 22 of the via 16 significantly overlie the substrate surfaces 34, the likelihood of inadvertent contact of solder from ball/bump 20 with the surface 34 increases, and shorting of the via 16 to wafer 2 may occur. It therefore becomes a requirement to provide a passivation layer 36 over surfaces 34 proximate solder/bumps/balls 20, as shown.

In this type of via-to-bump connection, the bumps/balls 20 are susceptible to cracking, particularly at the corners 26 of the via 16. Such cracking leads to break-off of solder from the via 16 due to failure of the via-to-bump adhesion. Without the application of a passivation layer 36 on the surface of the substrate, shorting failures are likely to occur.

In U.S. Pat. No. 6,355,181 to McQuarrie et al., a method is disclosed for making deep trenches having enlarged bottoms or bases. The method comprises applying a mask layer over a substrate, forming a hole in the mask layer and high energy plasma etching anisotropically to a desired depth. A protecting layer is then applied over the hole surfaces and mask layer. Selected portions of the protecting layer are removed from the base surface, and the base is etched to a desired shape.

It is desirable that the aforementioned disadvantages of the prior art be minimized.

SUMMARY OF THE INVENTION

The present invention comprises methods for forming conductive vias, herein also known as through-wafer interconnects (TWIs), in substrates and resulting structures and assemblies.

Other features and advantages of the present invention will become apparent to those of skill in the art through consideration of the ensuing detailed description of the invention, the accompanying drawings, and the appended claims.

BRIEF DESCRIPTION OF THE DRAWINGS

In the drawings, which depict exemplary embodiments of various features of the present invention, and in which various elements are not necessarily to scale.

DETAILED DESCRIPTION OF THE INVENTION

Figure 1A:
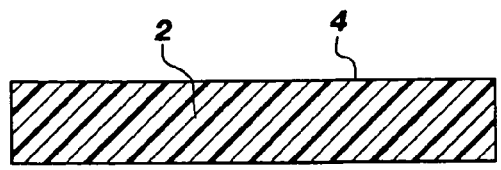
FIG. 1A is a cross-sectional depiction of a first act in the formation of conductive vias in a semiconductor substrate in accordance with the prior art.
Figure 1B:
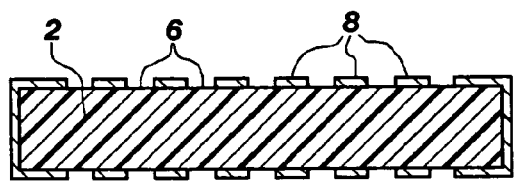
FIG. 1B is a cross-sectional depiction of a second act in the formation of conductive vias in a semiconductor substrate in accordance with the prior art.
Figure 1C:
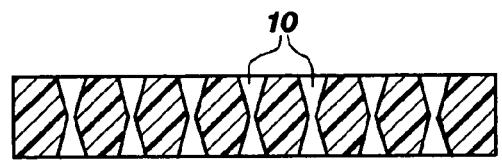
FIG. 1C is a cross-sectional depiction of a third act in the formation of conductive vias in a semiconductor substrate in accordance with the prior art.
Figure 1D:
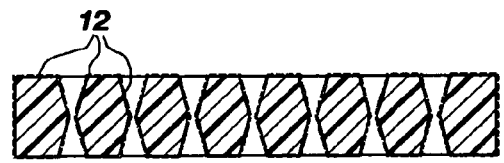
FIG. 1D is a cross-sectional depiction of a fourth act in the formation of conductive vias in a semiconductor substrate in accordance with the prior art.
Figure 1E:
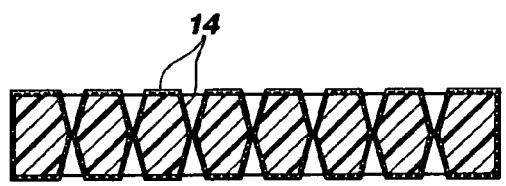
FIG. 1E is a cross-sectional depiction of a fifth act in the formation of conductive vias in a semiconductor substrate in accordance with the prior art.
Figure 1F:
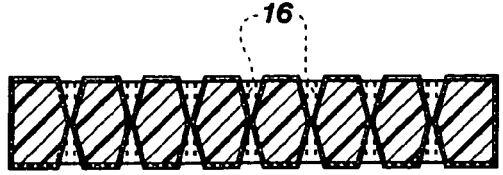
FIG. 1F is a cross-sectional depiction of a sixth act in the formation of conductive vias in a semiconductor substrate in accordance with the prior art.
Figure 2:
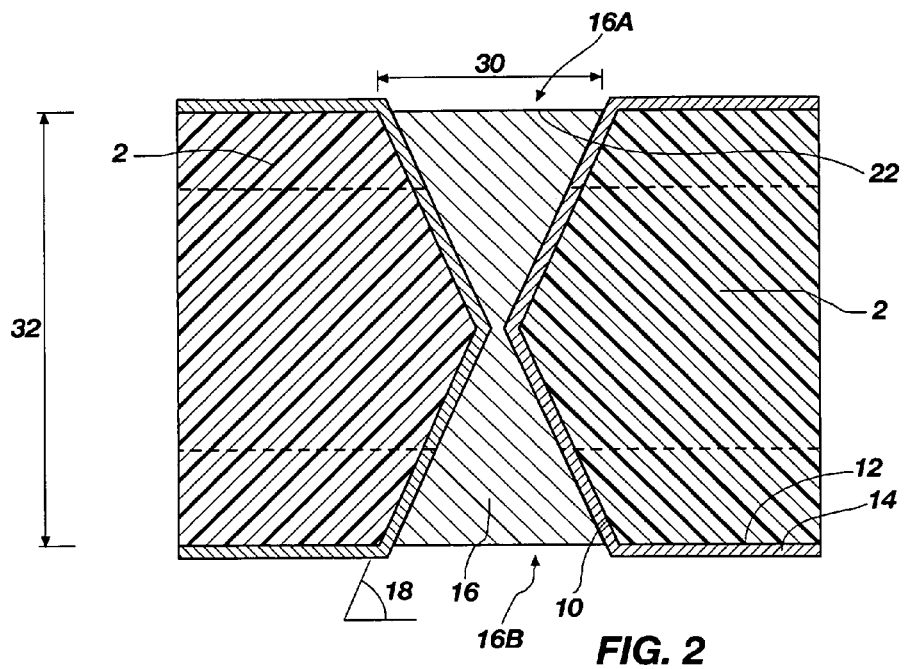
FIG. 2 is an enlarged cross-sectional view of a conductive via in a semiconductor substrate in accordance with the prior art.
Figure 3:
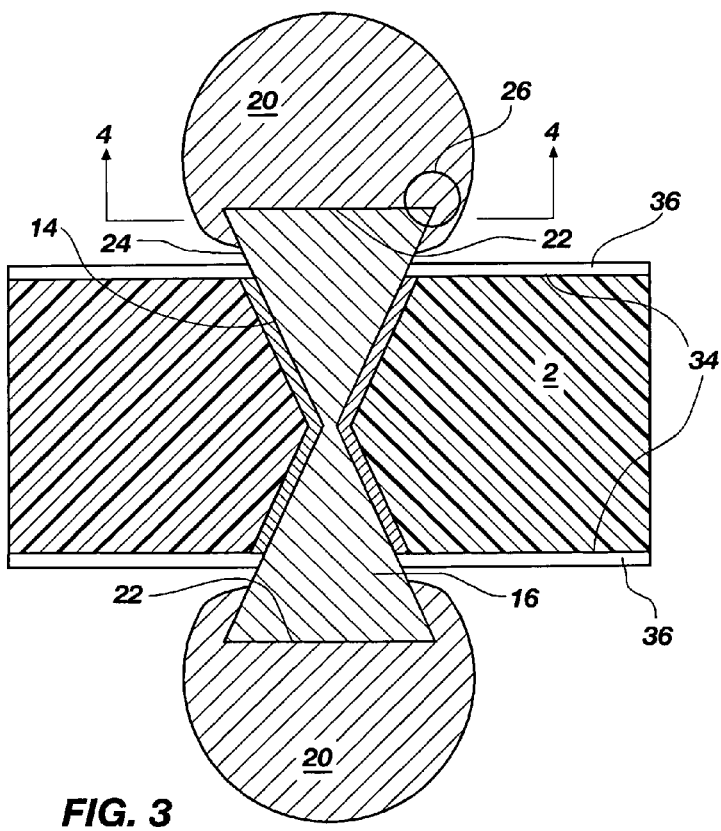
FIG. 3 is an enlarged cross-sectional view of a conductive via in a semiconductor substrate according to FIG. 2 following etchback of substrate surfaces and formation of solder bumps on the via ends.
Figure 4:
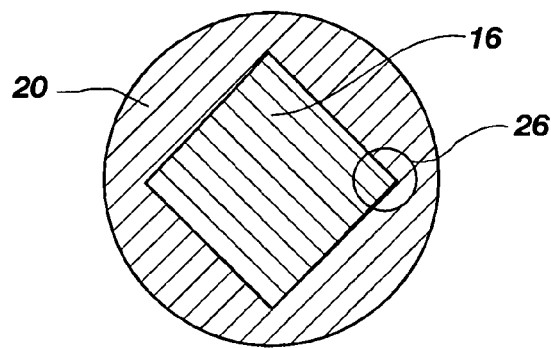
FIG. 4 is an enlarged cross-sectional view of a conductive via and solder bump attached thereto, as taken along line 4—4 of FIG. 3.

In the present invention, semiconductor wafers or portions thereof and substrates and components in which vias are to be formed are identified herein as "substrates" regardless of the purpose of the via or material of construction of the substrate or via. Thus, for example, the term "substrate" is used in reference to semiconductor wafers, semiconductor wafer portions, other bulk semiconductor substrates, semiconductor devices, interposers, probe test cards, and the like. The invention will be illustrated as applied to construction of a silicon, wafer-scale test card, and methods of making such vias in a wide variety of components are described, as well as the resulting components so made and associated structures and assemblies. The vias made by methods of the present invention have via ends which may be configured to have projecting ends comprising mesas or pillars of reduced size, flared or enlarged ends, or a combination thereof.

One exemplary embodiment of the method of the invention may be generally described as comprising (a) providing a semiconductor substrate with a mask layer of oxide or nitride on one or both major surfaces, (b) laser-drilling a precursor aperture completely through the substrate and mask layers, to provide a heat-affected zone of substrate material shielded by the overlying mask layer on one or both sides of the substrate, (c) subjecting the precursor aperture to shape etching, to remove the heat-affected material, leaving an aperture having an enlarged portion in the center of the substrate, tapering to at least one smaller aperture opening, and having a generally square cross-section, (d) lining the etched aperture with a passivation material, (e) filling the passivated aperture with a conductive via material to produce the conductive via, and (f) thinning the substrate on one or both sides to expose via end(s) having a generally trapezoidal shape. Optionally, an additional rounding etch act following the shaping etch rounds the corners of the shape-etched aperture, producing a via end with a frusto-conical shape. The substrate may be thinned by etching, by a mechanical abrasion process or a chemical-mechanical polishing or planarization (CMP) process to expose the via end (contactor end or stud) to a desired standoff distance.

Optionally, the precursor hole may be formed by anisotropic etching from one or both surfaces of the substrate.

The shape etching may be conducted with a tetramethyl ammonium hydroxide (TMAH) solution, which results in a distinctive undercut of the opening in the mask layer. The precise shape of a resulting via end varies, depending upon laser strength and duration as well as etch strength and duration, and other factors.

The shaped aperture, or shaped-and-rounded aperture is filled with a conductive material which may comprise a metal, metal powder, a metal or alloy powder, a flowable conductive photopolymer, a thermoplastic conductive resin, resin-covered particulate metal material, or other suitable material which may be used to form a solid conductive via. The shaped aperture or shaped-and-rounded aperture may be filled with the conductive material or first coating the aperture walls with a metal, followed by filling of the aperture.

The method of the invention may be used to form via hole or aperture diameters of conventional size, i.e. about 17 μm to about 150 μm, as well as much smaller via holes or apertures applicable to enhanced miniaturization of the future. The via holes or apertures are formed to produce trapezoidal or frustoconical via ends which may be directly attached to bond pads or optionally to solder bumps/balls.

The method of the invention provides substantial advantages. First, very small diameter vias may be formed in a dense pattern in a semiconductor substrate. The vias may be rapidly and precisely formed. The shape of the via ends of the via holes or apertures is enhanced to enable direct attachment to small, finely pitched bond pads. If the via ends are employed with solder balls/bumps, the danger of ball cracking, solder shorts, etc. is much reduced in comparison to the state of the art. Inasmuch as a non-conductive layer may girdle the via ends, and solder wetting and bonding areas do not generally overlie the bare substrate, further passivation of the substrate area surrounding the vias is typically unnecessary.

The invention will be illustrated as applied to construction of a silicon wafer-scale test card having vias and methods of making such vias in a wide variety of components are described, as well as the resulting components so made. The vias made by methods of the present invention have via ends which may be configured as projecting or protruding ends comprising mesas or pillars of reduced size.

Figure 5:
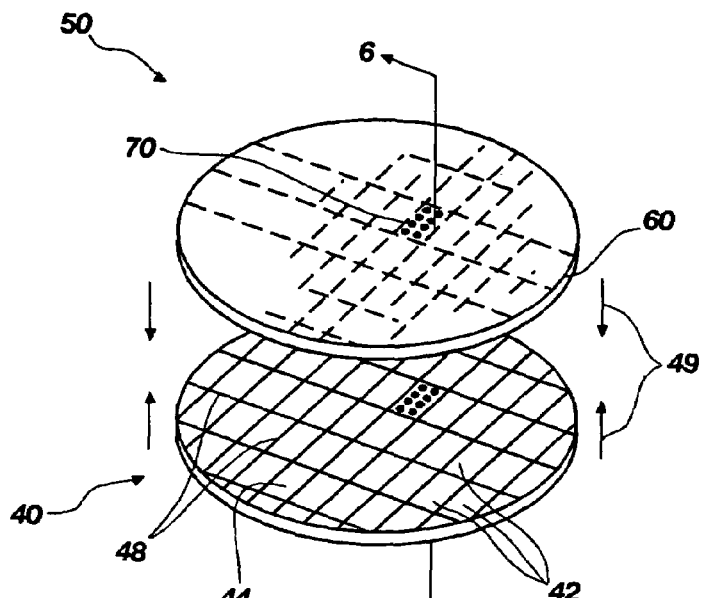
FIG. 5 is a perspective view of a multi-die wafer and a wafer-size contactor card adapted for connecting the wafer bond pads to a test apparatus, in accordance with the present invention.
Figure 6:
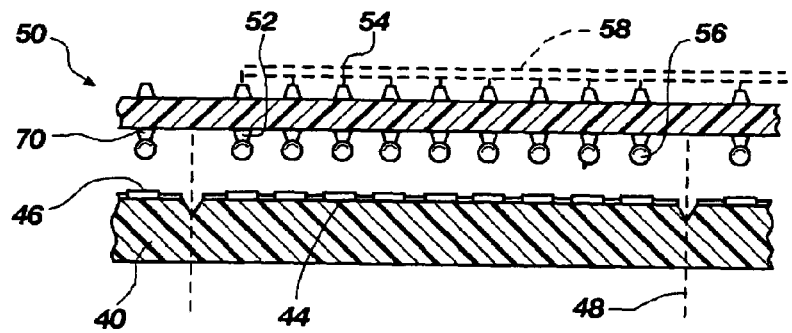
FIG. 6 is a side view of a multi-die wafer and contactor card in accordance with the present invention.

In the present invention, methods are illustrated for forming conductive TWIs (also known as vias and feedthroughs) in substrates of semiconductor material with improved configurations of their ends or contacts. As illustrated in drawing FIGS. 5 and 6, a wafer test contactor card 50, also commonly termed a "probe" card, may be produced for the testing of a large number of integrated circuit or semiconductor dice 42 in, for example, a substrate comprising a silicon wafer 40. The semiconductor dice 42 are fabricated in wafer 40 for subsequent separation along cut lines 48. As illustrated in drawing FIG. 6, the contactor card 50 may have a large number of vias or TWIs 70 having first ends 52 which are aligned with corresponding bond pads 46 on the active surface 44 of each die 42 of the wafer 40. The first ends 52 and second ends 54, also called stud ends herein, are shown as having a generally truncated pyramidal or truncated conical shape, in contrast to the shape of prior art studs previously described. The first ends 52 of vias 70 may be configured to directly contact bond pads 46, or to accommodate the attachment of solder or other metallic "balls" or "bumps" 56, or to be joined to metal traces or wires or other types of conductive structures of semiconductor dice 42. The second ends 54 as illustrated in drawing FIG. 6 may be provided with metallization in the form of conductive lines 58 as shown in broken lines to connect to a test apparatus, not shown. Moving the contactor card 50 in the direction 49 to temporarily contact the metallic balls 56 with the bond pads 46 on the wafer's active surface 44 permits very rapid testing of each semiconductor die 42 on the wafer 40 for operability. Of course, first ends 52 may be employed to directly contact bond pads 46.

Use of the methods of the invention enables small via diameter and pitch, i.e. spacing. Small via spacing may be achieved with high precision (accuracy) and with small feature dimensions, i.e. resolution with high repeatability. The end shape(s) of the vias 70 enables use of solder balls/bumps 56 thereon without the cracking problems with acute angled ends. Smaller solder connections may be used for permanent connections than is possible in the state of the art. Alternatively, the via ends 52 and/or 54 may be directly contacted with a bond pad 46 or other metallization, or bonded thereto, without using intervening solder balls/bumps 56. Thus, the sizes of bond pads 46 may be significantly reduced, i.e., reduced to 5×5 microns or even as small as 2×2 microns, and the size of solder balls, if used, may be correspondingly reduced.

Generally illustrated in drawing FIGS. 7 through 14, are acts common to each of the embodiments of the inventions as illustrated herein, comprising (a) providing a substrate 60 of semiconductor material, (b) providing a dielectric etch mask layer 68 on at least one surface 62, 64 of the substrate 60, (c) forming a precursor aperture 80A through the substrate 60 and etch mask layer(s) 68, (d) conducting a shaping etching to form a shaped aperture 80B with lateral enlargement in a central region, proximate central axis 106 and end portions 82, 84, which may be sloped, extending from the central region to terminate at an etch mask layer 68, (e) optionally, conducting a "rounding" etch to change the aperture's cross-sectional shape from square to rounded, (f) providing a passivation layer 92 over the side wall surfaces 76 of the shaped aperture 80B or rounded aperture 80C, (g) filling the passivated aperture with one or more conductive materials 100 to form a conductive via (TWI) 70, and (h) thinning one or both surfaces 62, 64 of the substrate 60 to expose the end(s) 52, 54 of the conductive via 70. In the manufacture of articles in the form of through wafer interconnects or vias 70 of the present invention, each of the acts (a) through (h) and modifications thereof of the various embodiments of inventions are discussed in further detail, infra. It is understood that the terms "upper" and "lower" are used herein to define opposed positions of a substrate surface, via ends, and the like, rather than the actual position thereof. Likewise, the terms "first" and "second" do not refer to a specific orientation.

Figure 7:
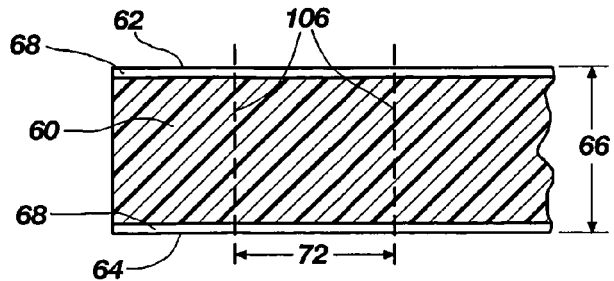
FIG. 7 is a cross-sectional view of a portion of a substrate used to form a contactor card in accordance with the invention.
Figure 8:
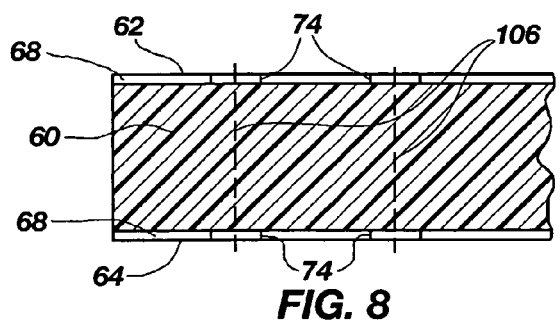
FIG. 8 is a cross-sectional view of a portion of a substrate following a primary etch act for via formation in a contactor card in accordance with an embodiment of the invention.

Referring to drawing FIG. 7, a substrate 60 of a semiconductor material such as, for example, a silicon wafer is illustrated having a first surface 62 and a second surface 64, both of which are covered with an etch mask layer 68 such as silicon dioxide or nitride. Depending upon the desired configuration of the via, one of the surfaces 62, 64 may be left unmasked and unpassivated to produce a larger, even flared via end as described, infra. The substrate 60 is illustrated as a semiconductor wafer with total thickness 66 and configured for the creation of vias 70 having central axes 106 and pitch 72. While the examples shown herein relate primarily to silicon or semiconductor wafers, the methods described herein may be used to form conductive vias 70 in other semiconductor materials.

Figure 10A:
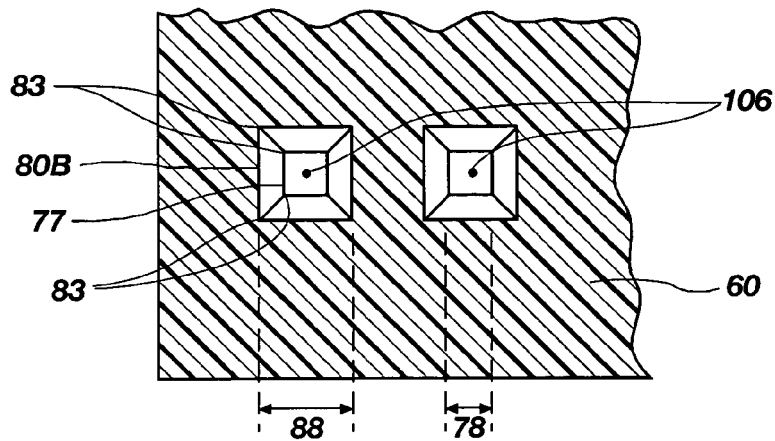
FIG. 10A is a cross-sectional view of a portion of a substrate following a central aperture-shaping etch act in a contactor card, as taken along line 10A—10A of FIG. 10.
Figure 9A:
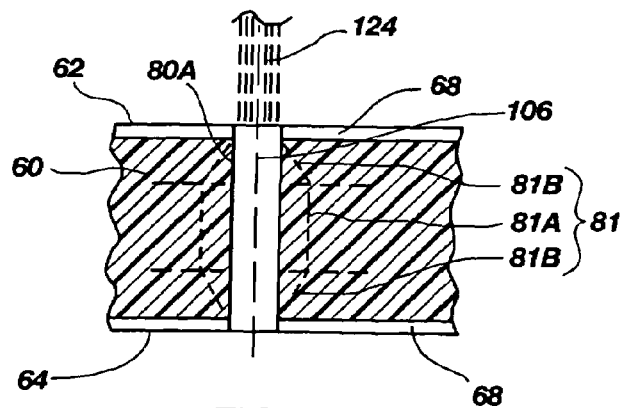
FIG. 9A is an enlarged cross-sectional view of a portion of a substrate with a laser-formed precursor aperture through a substrate in accordance with an embodiment of the invention.
Figure 9:
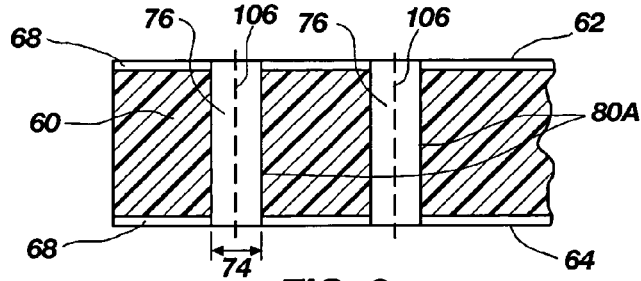
FIG. 9 is a cross-sectional view of a portion of a substrate following the formation of precursor holes in a contactor card in accordance with an embodiment of the invention.

As illustrated in FIG. 9, precursor apertures 80A are formed in the substrate 60 and pass completely through the substrate about central axes 106. In one embodiment, the precursor apertures 80A are formed by laser cutting or ablation through the substrate 60 including outer etch mask layers 68 using a laser beam 124, as illustrated in FIG. 9A. The apertures 80A are shown in this embodiment of the invention having a generally uniform cross-section along axis 106. The cross-sectional shape of the precursor apertures 70 may be generally square, oblong or circular. The laser power, duration and beam focus are controlled as known in the art to produce a generally uniform aperture 80A of the desired shape. The width 78 of the resulting aperture openings 77 may be as narrow as obtainable by laser ablation. For example, aperture opening widths 78 as narrow as about 17 to about 30 μm may be precisely formed with current state-of-the-art laser equipment (FIG. 10A). However, the minimum usable opening width 78 may be limited by the ability to effectively passivate the internal side wall surface 76 of the completed aperture and fill the aperture with electrically conductive material through a small opening, particularly when the aperture has a high depth-to-diameter ratio.

In an alternative embodiment of the invention, an act (see FIG. 8) prior to the structure depicted in FIG. 9 replaces laser cutting with an etching act. As illustrated in drawing FIG. 8, guide holes 74 are first formed, e.g., etched in the etch mask layers 68 about axes 106. The precursor aperture 80A is then formed (FIG. 9) by dry anisotropic etching of silicon from one or both surfaces 62, 64 of the substrate 60. Dry anisotropic etching, commonly known as reactive ion etching (RIE), is well known in the art.

Figure 10:
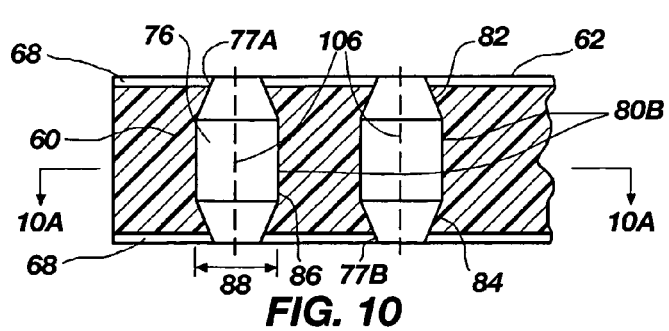
FIG. 10 is a cross-sectional view of a portion of a substrate following an aperture-enlarging shaping etch act in a contactor card in accordance with an embodiment of the invention.
Figure 11:
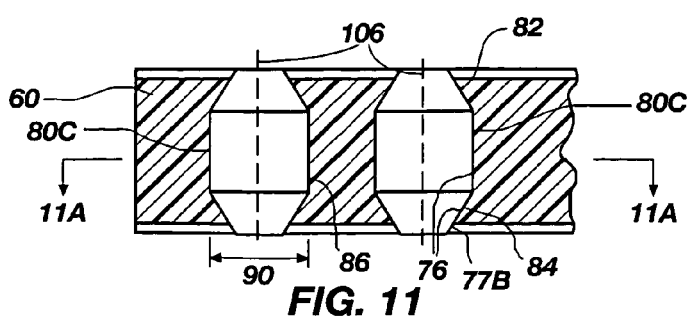
FIG. 11 is a cross-sectional view of a portion of a substrate following a rounding-etch act in shaped apertures of a contactor card in accordance with an embodiment of the present invention.

Whether the precursor aperture 80A is formed by laser ablation or etching, the next major act, illustrated in drawing FIG. 10, comprises a shaping etch to remove silicon surrounding precursor aperture 80A and laterally etch the precursor aperture 80A. Where the precursor aperture 80A is formed by laser, the substrate's silicon outside of the immediate aperture 80A is heat-damaged (commonly termed a "heat-affected zone," or "HAZ") which may enhance removal of the material by etching. As illustrated in drawing FIG. 9A, the heat-affected zone 81 includes a central zone 81A with substantially uniform cross-section and end zones 81B between the central zone and the etch mask layers 68, wherein the degree of undercutting of silicon is approximately proportional to the distance from the etch mask layer 68.

A preferred method of using a shaping etch comprises the application of tetramethyl ammonium hydroxide (TMAH) as a 9:1 ratio of TMAH solution to deionized (DI) water. The TMAH solution is available as a six percent (6%) solution of TMAH in propylene glycol, which may be used without damage to wafer circuitry, as it does not degrade metallization. The etchant is applied by submersion of substrate 60 into a heated wet process tank full of the aforementioned TMAH and DI water solution. The cross-section of the shaped aperture 80B so formed is generally square (see FIG. 10A) rather than circular, because the TMAH etchant solution is preferential to 100 or 110 crystallographic orientations of the silicon. The end portions 82, 84 of the shaped aperture 80B (FIG. 10) are thus generally trapezoidal in shape, with outer corners 83 and base width 88 (which also defines the width of central via portion 86) and opening width 78. Other etching systems may be alternatively used, including, for example, dry "Bosch" style etching using an inductively coupled plasma for deep silicon etching and the aforementioned dry RIE process, as well as other known etch processes suitable for the material of substrate 60 such as, for example, the Advanced Silicon Etch process offered by Surface Technology Systems. HF solutions and KOH solutions as well as more concentrated TMAH solutions are suitable etchants for silicon, but may require masking of selected portions of substrate 60 to avoid damage to metallization. Aperture shapes will vary depending upon the etching system employed and the material and crystallographic orientation of the material of substrate 60.

Figure 11A:
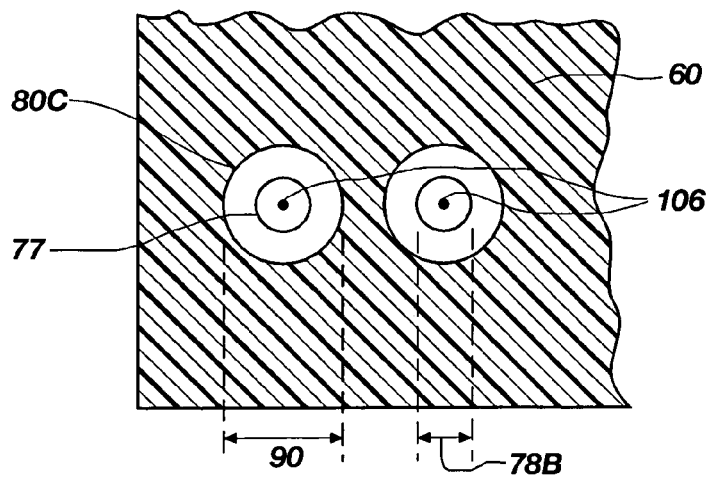
FIG. 11A is a cross-sectional view of a portion of a substrate following a rounding-etch act in shaped apertures in a contactor card, as taken along line 11A—11A of FIG. 11.

A shaped aperture 80B may alternatively be formed by a variation of a method for forming enlarged aperture regions of a deep trench or hole. As described in U.S. Pat. No. 6,355,181 to McQuarrie, a masked substrate is etched using a fluorine-containing etchant gas or vapor in the absence of a plasma through an opening in the mask to a desired depth with a base. A layer of protecting material is applied to the base and surfaces of the hole and mask, then removed from the base of the hole. Further etching is conducted to enlarge the hole in the region of the base. This method may be used to selectively shape an aperture to a configuration of this invention. The disclosure of the U.S. Pat. No. 6,355,181 to McQuarrie is incorporated herein by reference.

Where a via end 52, 54 is to have a discrete conductive element in the form of a solder ball/bump 56 bonded thereto, producing stress points at corners 83, the shaped aperture 80B may be subjected to a further rounding-etch act, producing a more circular via 70 and virtually eliminating the corners. As illustrated in drawing FIGS. 11 and 11A, an isotropic etch results in a more circular aperture 80C with rounded openings 77 of diameter 78B and enlarged central portions 86 of diameter 90. Various etchants may be utilized, including, for example, a wet etch with a combination of ammonium fluoride, phosphoric acid, hydrogen peroxide and DI water. Other isotropic etchants may alternatively be used to achieve uniform etching in all directions, including a dry etch with either hydrobromic acid (HBr) or $HBrO_2SF_6$. Thus, substantially frustoconical via ends 52, 54 may be produced.

Figure 12:
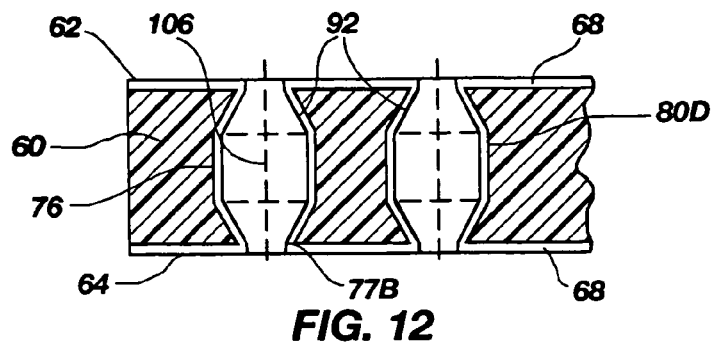
FIG. 12 is a cross-sectional view of a portion of a substrate following passivation of the surfaces of shaped/rounded apertures in a contactor card in accordance with an embodiment of the invention.

In the next act illustrated in drawing FIG. 12, an insulative (passivation) layer 92 is deposited or formed on the side wall surfaces 76 of the shaped aperture 80B or shaped and rounded aperture 80C, creating passivated aperture 80D in preparation for metallizing the aperture. The passivation layer 92 may comprise silicon oxide, silicon nitride, or another material, including one of a wide variety of organic (polymeric) materials which are available for passivation. The material may be applied by chemical vapor deposition (CVD) or other deposition method. An oxide layer may be formed by oxidation of the material of substrate 60, or deposition. Any effective method for forming a thin passivation layer 92 on the aperture side wall surfaces 76 may be utilized. In general, it is unnecessary to passivate the substrate surfaces 62, 64 after the aperture is formed, inasmuch as at least one surface is already passivated by the etch mask layer 68, and subsequent removal of etch mask layer 68 in a thinning act renders the extra application act valueless. Furthermore, the passivation layer 92 extends to each end 52, 54 of the aperture 80B, 80C of the unthinned substrate 60 to insulate the conductive material of via 70 which is to be formed.

Figure 13:
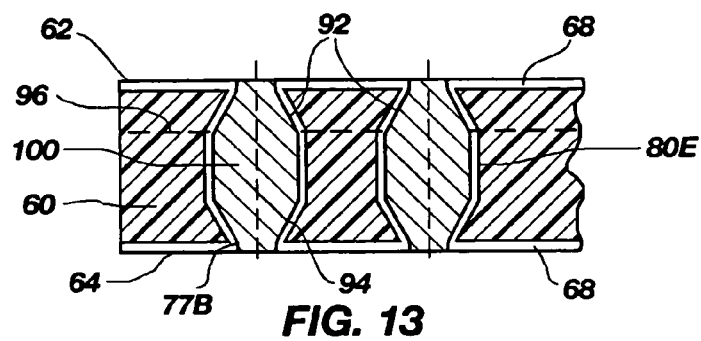
FIG. 13 is a cross-sectional view of a portion of a substrate following filling of the passivated shaped/rounded apertures in a contactor card with a conductive material to form conductive vias in accordance with an embodiment of the invention.

As illustrated in drawing FIG. 13, the passivated aperture 80D is then "metallized" by filling with a conductive material or materials 100, forming a conductive pathway or via 70 spanning the thickness of the substrate 60. The particular conductive material(s) 100 may vary, and the method of deposition may also vary. For example, the conductive filler material 100 may comprise a solder such as a tin/lead material, or copper, nickel, silver, tungsten, or other metal or alloy. Electroplating or electroless plating techniques may be used to fill passivated aperture 80D. Copper, aluminum and other metals may also be deposited by a metalorganic chemical vapor deposition (MOCVD) process. Alternatively, the conductive material may comprise a conductive polymer or conductive material entrained in a polymer, such as conductive or conductor-filled expoxy. The polymer may be placed in a passivated aperture 80D by needle dispenser, chemical vapor deposition (CVD) or other means known in the art, and cured to a solidified state. Nano-size particles of a metal, such as silver, in an organic carrier may also be placed in the aperture 80D and converted to a cohesive solid by heating methods known in the art. Conductive material-filled aperture 80E is depicted in FIG. 13.

Figure 13A:
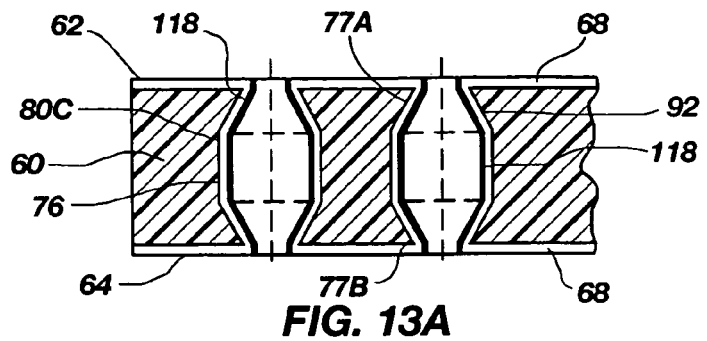
FIG. 13A is a cross-sectional view of a portion of a substrate following the application of a metal layer on the surfaces of passivation layers in shaped/rounded apertures in a contactor card in accordance with an embodiment of the invention.
Figure 13B:
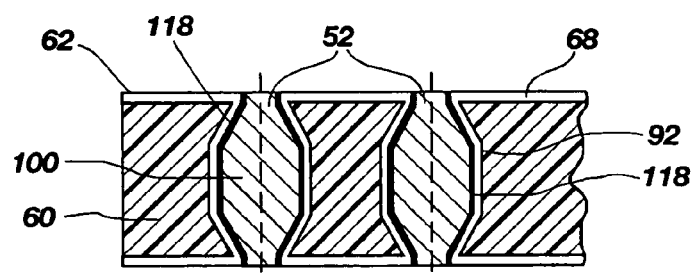
FIG. 13B is a cross-sectional view of a portion of a substrate of FIG. 13A in which a conductive material has been deposited over the metal layers in the shaped/rounded apertures in a contact card in accordance with an embodiment of the invention.

Any appropriate method for filling a narrow aperture with the particular material 100 may be used. In one example, illustrated in drawing FIGS. 13 and 13A, the surfaces 94 of passivation layer 92 are first coated with a thin layer of nickel, copper or tungsten as a "seed layer" 118 by an appropriate method such as chemical vapor deposition (CVD) or plasma-enhanced chemical vapor deposition (PECVD), and then (see FIG. 13B) the aperture is filled with a conductive material 100, by an electroless deposition process, for example. Alternatively, a metal seed layer 118 may be deposited on surfaces 94 of the passivation layer 92 and a metallic filler conductive material 100 applied by electroplating within the aperture 80D, or an electrode placed across one side of substrate 60 and electroplating effected thereon to fill passivated aperture 80D from one end thereof.

The latter approach is especially suitable for probe cards, where the second via end 54 is to be generally coplanar with the second surface 64, as the bottom aperture opening 77B may be closed off with a conductive plate, not shown. A conductive metal filler material 100, such as copper, is then electroplated from a solution entering top aperture opening 77A upwardly from the bottom to fill passivated aperture 80D.

Where the conductive material 100 is solder, dip or wave soldering may be employed to fill the passivated aperture 80D. Further, a solder ball may be placed over each passivated aperture 80D, heated to reflow and then drawn, as by a vacuum or by capillary action if passivated aperture 80D is lined with a solder-wettable material, into apertures 80D. Alternatively, a solder paste may be stenciled or squeegeed into the apertures 80D followed by heating to reflow the solder and drive off organics and cooling to solidify the solder alloy. Illustrated in drawing FIG. 13, the degree to which the first surface 62 is to be thinned in a following act is indicated as thinning line 96.

Figure 14:
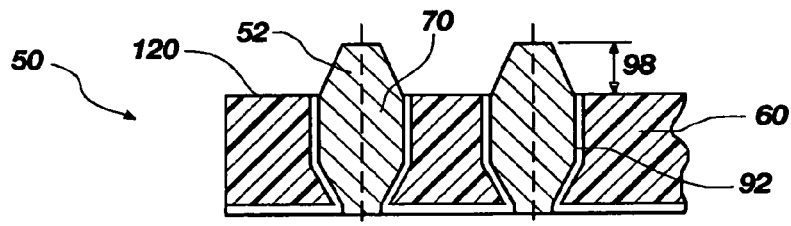
FIG. 14 is a cross-sectional view of a portion of a substrate following thinning of one side of a contactor card to expose the via ends in accordance with an embodiment of the invention.
Figure 15:
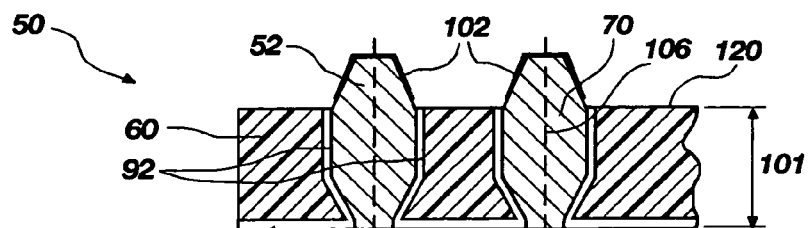
FIG. 15 is a cross-sectional view of a portion of a substrate following the application of a metal to the via ends in a contactor card in accordance with an embodiment of the invention.
Figure 16:
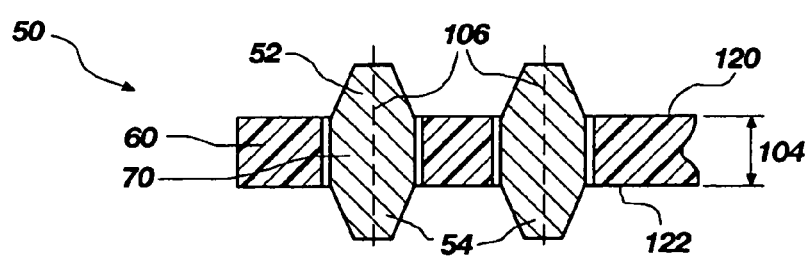
FIG. 16 is a cross-sectional view of a portion of a substrate following two-sided thinning to expose via ends on both sides in a contactor card in accordance with an embodiment of the invention.

Turning now to drawing FIG. 14, the next act is seen to be a thinning of first substrate surface 62 (to thinning line 96 of FIG. 13) to expose the first ends 52 of vias 70 as studs projecting from bare thinned line 120, resulting in a substrate thickness 101 (FIG. 15). Thinning may be conducted by conventional methods such as etching, backgrinding or abrasive CMP techniques, as known in the art. The opposing substrate surface may also be thinned to expose the second ends 54 of vias 70 as studs projecting from bare thinned surface 122, as shown in FIG. 16. The substrate 60 itself is thus further thinned to a thickness 104. While the via ends 52 are configured to produce an improved connection with solder balls/bumps, these structures may, alternatively, be used when substrate 60 is configured (for example) as a probe card for direct contact with a conductor e.g., bond pad or other metallization of a semiconductor die, provided that the standoff distance 98 (see FIG. 14) is sufficient. In the present state of the art, thinning a substrate surface 62 to produce a standoff distance 98 of about 300 μm meets the above criteria, enabling via end-to-bond pad contact without the presence of an intervening solder ball or solder bump.

Figure 16A:
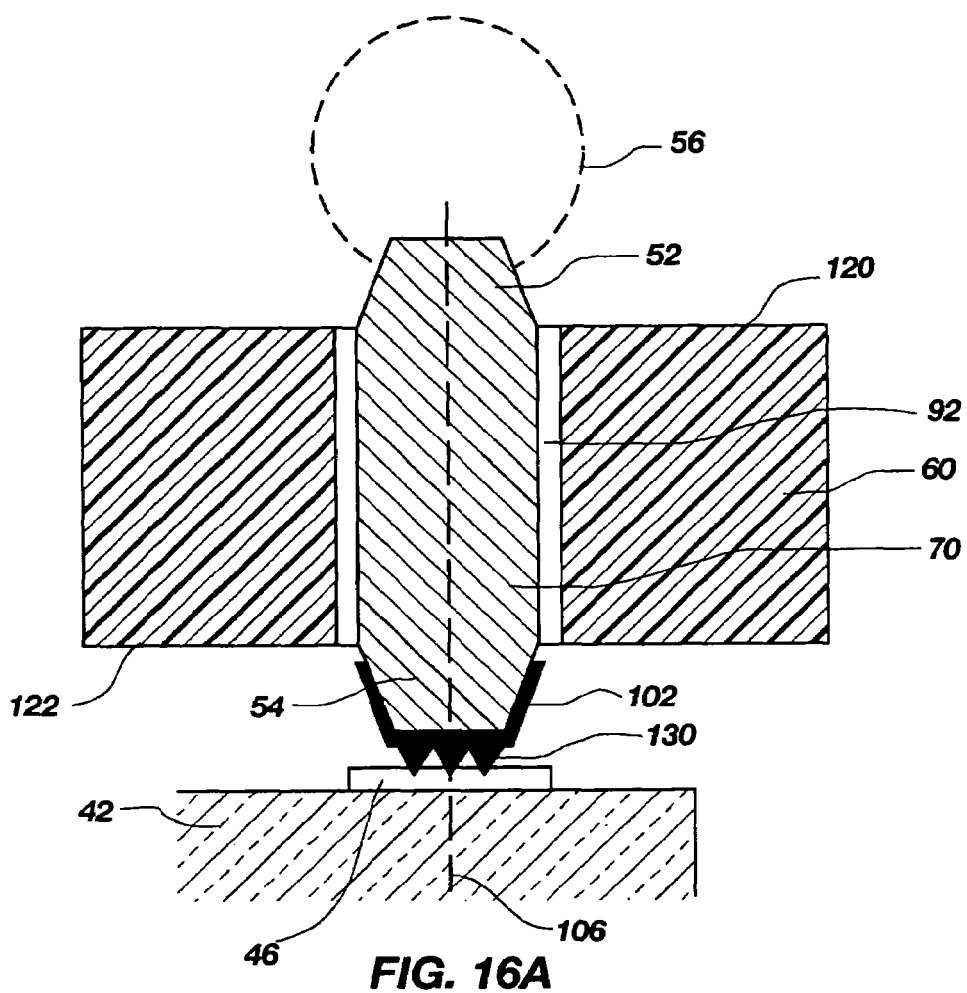
FIG. 16A is an enlarged cross-sectional view of a portion of a substrate following two-sided thinning to expose via ends on both surfaces of a contactor card, showing via end attachment to solder balls/bumps in accordance with an embodiment of the invention.

Following via formation and substrate thinning, one or both of exposed, protruding via ends 52, 54 may be coated with a metal overlay 102 such as copper, silver, gold, tungsten or nickel. Typically, nickel may be used to coat a via end 52, 54 to be contacted with solder or a via end 52, 54 comprising solder. A copper via end 52, 54 may, for example, be plated with gold. Such a coating of via end 52 is illustrated in drawing FIG. 15. The particular overlay metal may be chosen and applied to provide an electrical connection which is of low resistance and ohmic, and which may enhance cohesion between a via end 52 or 54 and a bond pad 46 or metallization of a semiconductor die, not shown in this figure. The via end 52, 54 may, optionally, include at least one raised projection 130 configured to contact and/or penetrate bond pads 46, as depicted in FIG. 16A. Such projections 130 may be formed on a via end 54, for example, by methods described in U.S. Pat. No. 5,541,525 to Wood et al., assigned to the assignee of the present application, the disclosure of which is incorporated herein by reference thereto. For example, the raised projections 130 may comprise sharp spurs, rounded domes, or otherwise shaped projections which enhance connection to a bond pad or other metallization. In the example illustrated in drawing FIG. 16A, the opposite via end 52 is shown as being bare, i.e. without a metal overlay 102 or raised projections 130 thereon.

Figure 14A:
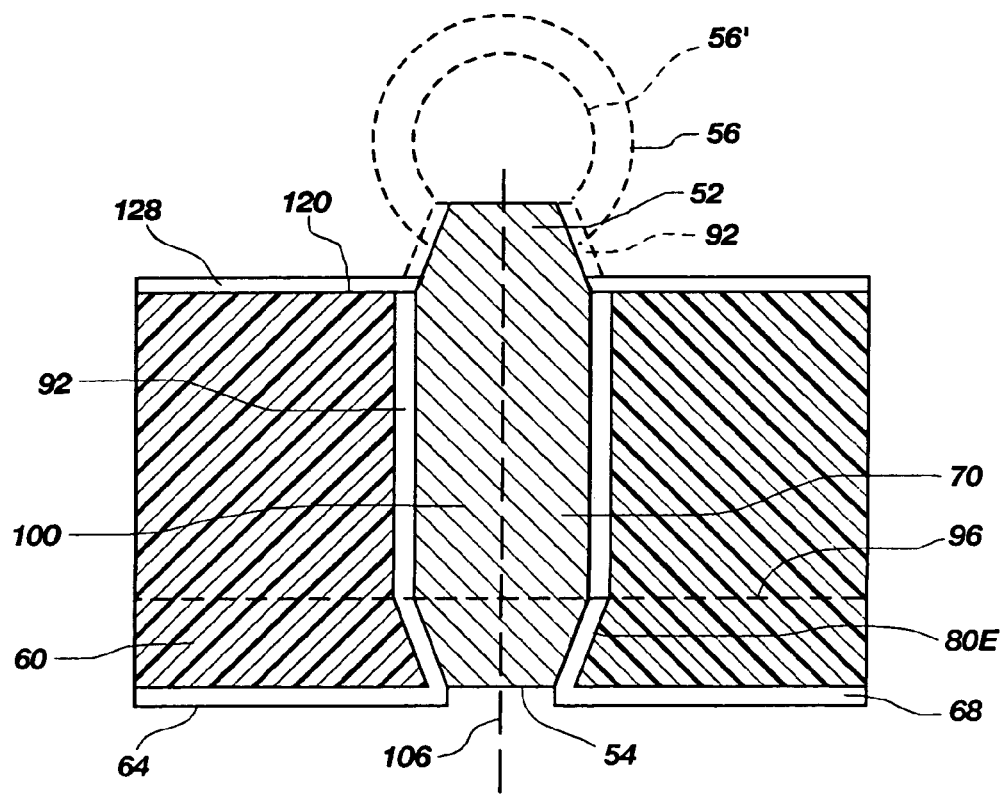
FIG. 14A is an enlarged cross-sectional view of a portion of a substrate following thinning of one side of a contactor card to expose a via end in accordance with an embodiment of the invention, showing attachment to a solder ball/bump.

As illustrated in drawing FIG. 14A, a solder ball or bump 56 may be attached to a first projecting via end 52 for electrical connection to a bond pad or metallization of another component. The exposed portion of second, opposed via end 54 may be connected to a conductive member, not shown, such as a solder ball/bump, wire bond, etc. Because of passivation layer 92 about the periphery of via ends 52, 54, it may not be generally necessary to provide a further passivation layer 128 as shown in FIG. 14A on the thinned substrate line 120 and/or surface 122. However, in particular applications where shorting is likely to occur, a passivation layer 128 may be applied to the thinned line 120 and/or surface 122 to prevent such shorting. It is further contemplated that passivation layer 92 may remain on projecting via ends as shown in broken lines to constrain the wetting of conductive member such as a solder ball/bump to the distal end surfaces of via ends 52, 54, so that a smaller solder ball/bump 56' may lie over the end surfaces, again as shown in broken lines.

Figure 16B:
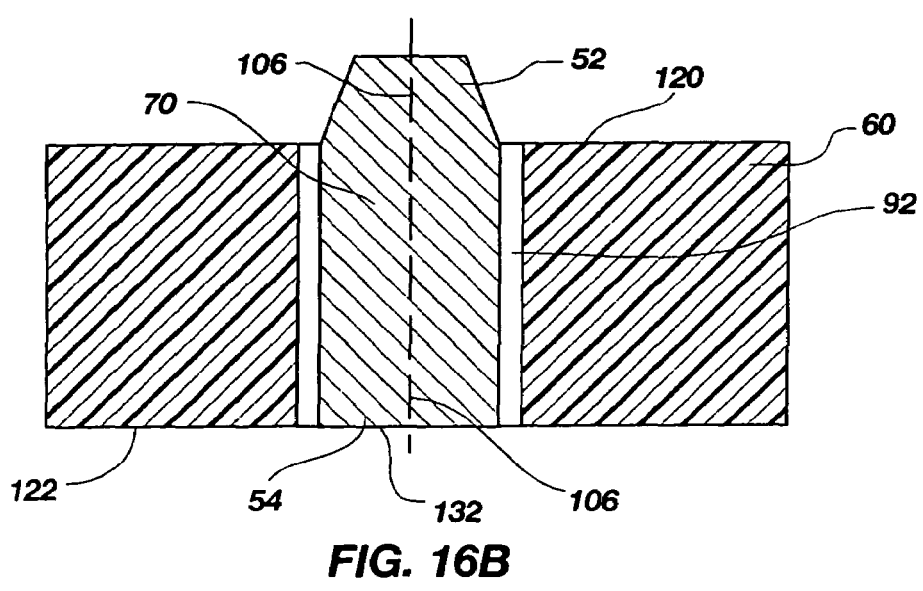
FIG. 16B is an enlarged cross-sectional view of a portion of a substrate following thinning of a first surface of a contactor card to expose one via end as a stud and in which the opposite via end is exposed as a surface generally coplanar with a second substrate surface according to an embodiment of the invention.

As illustrated in drawing FIG. 16B, one embodiment of the invention includes the full exposure of one via end 52, and the opposite via end 54 may be leveled, typically during the substrate thinning as effected by planarization, to have an end surface 132 which is approximately co-planar with thinned surface 122. Alternatively, thinning may be effected so that via end 54 exhibits a positive standoff less than would otherwise occur with full thinning to thinned surface 122.

Figure 17:
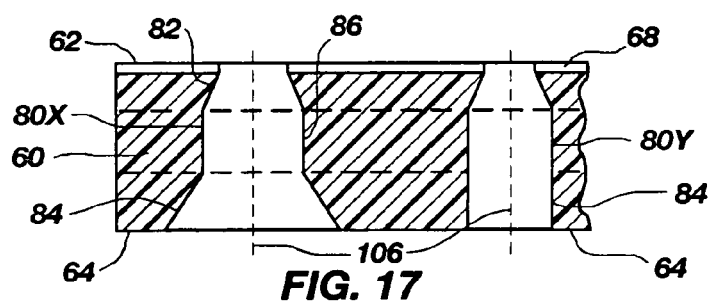
FIG. 17 is a cross-sectional view of a portion of a substrate showing aperture formation for constructing a via having differing end configurations in accordance with the present invention.
Figure 18:
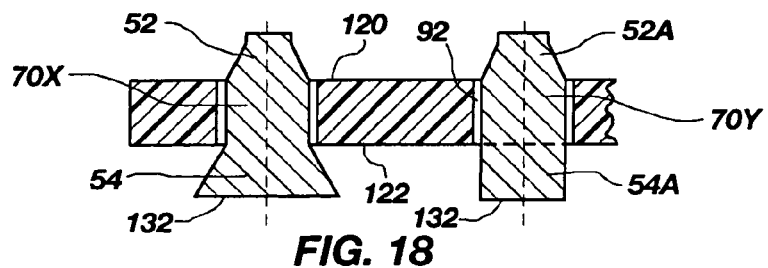
FIG. 18 is a cross-sectional view of a portion of a substrate showing vias with differing end configurations resulting from the aperture formations shown in FIG. 17 and two-sided thinning, in accordance with embodiments of the present invention.

The methods of the invention may be used to produce via end configurations which are non-uniform, that is, one via end 52 differs from the opposite via end 54 in shape, size, standoff distance, composition or other configuration variable. Illustrated in drawing FIG. 17 is a first shaped via aperture 80X having a first end portion 82 configured as a reduced stud, and a second end portion 84 flared in accordance with the prior art. The shaped via aperture 80X may be formed by a combination of laser cutting from both surfaces 62, 64, followed by etching to complete the internal via shape. Alternatively, etching of a substrate 60 having no aperture mouth constraining etch mask layer on surface 64 may be conducted to produce the indicated aperture shape. A semi-isotropic etch using TMAH for example, will produce an aperture resulting in a flared via end. The substrate may be left unthinned, or be thinned as previously described to produce a projecting via end portion 84. The completed via ends 52, 54 are illustrated in drawing FIG. 18 with respect to via 70X. In the second shaped via aperture 80Y illustrated in drawing FIG. 17, the second via aperture end portion 84 has a "post" configuration of uniform cross-sectional dimensions, as formed by anisotropic etching from one or both surfaces 62, 64 (without an etch mask layer 68 over surface 64), or by laser cutting from via end 52 followed by etching, all without an etch mask layer 68 over surface 64. The resulting via 70Y having via ends 52A and 54A is depicted in FIG. 18. As already described in relation to drawing FIG. 16B, the via end 54 may be leveled or thinned in the thinning act of second substrate surface 64 to a reduced stand-off distance 98 (see FIG. 14).

Figure 19:
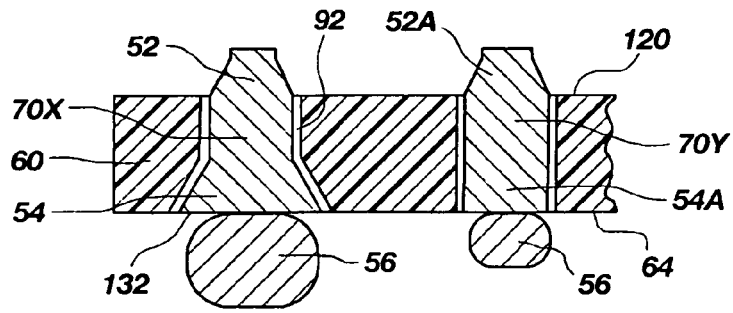
FIG. 19 is a cross-sectional view of a portion of a substrate showing vias with differing end configurations resulting from the aperture formations shown in FIG. 17 and one-sided thinning, in accordance with embodiments of the present invention.
Figure 13C:
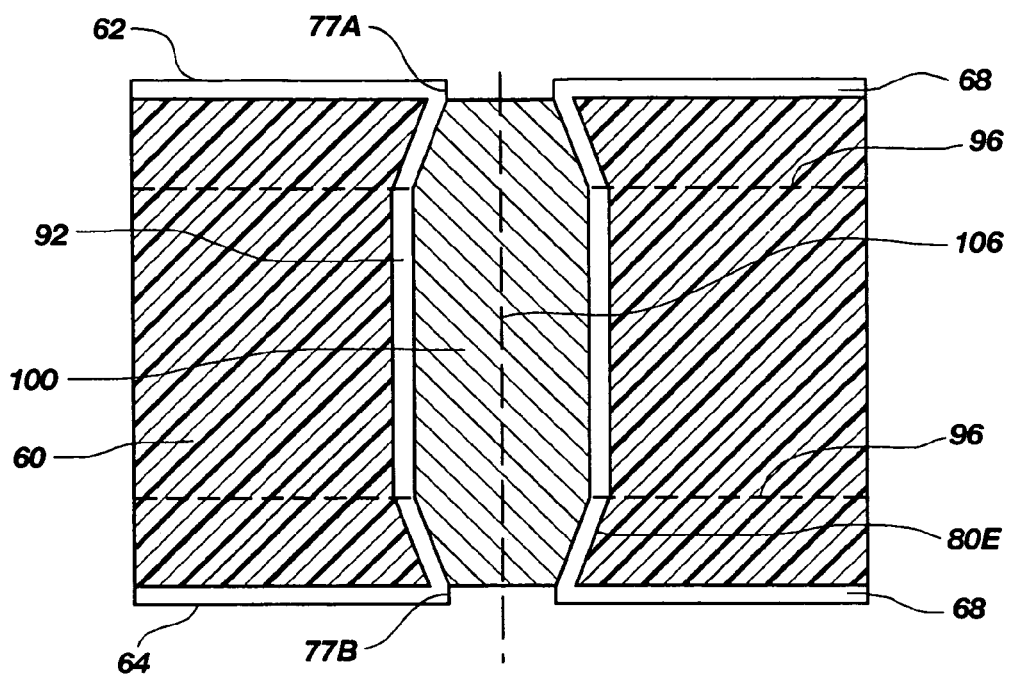
FIG. 13C is an enlargement of a cross-sectional view of a portion of a substrate following filling of the passivated shaped/rounded apertures in a contactor card with a conductive material to form conductive vias in accordance with an embodiment of the invention.

The substrate surface 64 may alternatively be left unthinned, so that via ends 54 remain substantially within the substrate 60, separated therefrom by passivation layer 92. As shown in FIG. 19, the end surfaces 132 of the second ends 54, 54A are exposed for connection to solder balls/bumps 56 as shown, or to metallization layers or other connecting structures, not shown.

It is important to note that the various configurations of via ends 52 and 54 may be utilized in any combination in a substrate 60 to achieve a desirable connection result.

Illustrated in drawing FIGS. 20 through 27 are various types of apparatus which may be formed by use of the via interconnections of the invention. These embodiments of the invention are not exhaustive in nature, but are merely examples.

Figure 20:
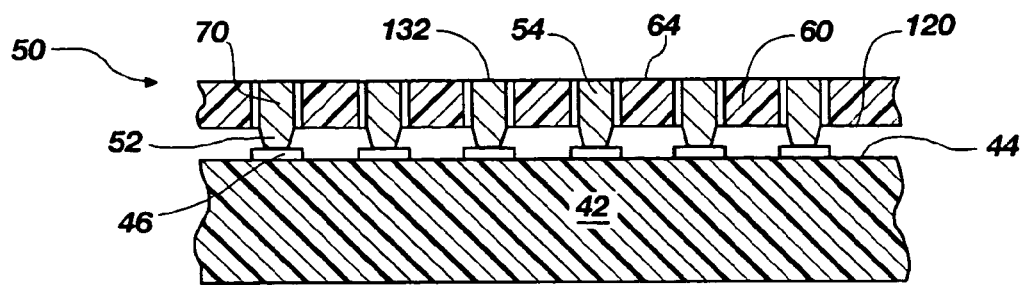
FIG. 20 is a cross-sectional side view of a portion of an exemplary probe card formed of a substrate through which a plurality of vias is constructed in accordance with the present invention.

Illustrated in drawing FIG. 20, the substrate 60 with vias 70 comprises an exemplary wafer test contactor, or probe, card 50 of the invention. The first ends 52 of the vias 70 comprise contactors of the invention for temporary direct contact with bond pads 46 on the active surface 44 of a semiconductor die 42. The active surface 44 of semiconductor die 42 is generally parallel to the opposing thinned line 120 of the probe card 50. The opposing via ends 54 are shown having exposed surfaces 132 generally coplanar with substrate surface 64, for connection to a test circuit, not shown, via metallization traces, wire bonds, or the like. Although the via ends 54 are shown as being proximate an unthinned surface 64 of the substrate 60, it is understood that the substrate surface 64 may be thinned to expose via ends 54 and achieve a similar projecting result as with via ends 52, as illustrated in drawing FIG. 16B.

Figure 21:
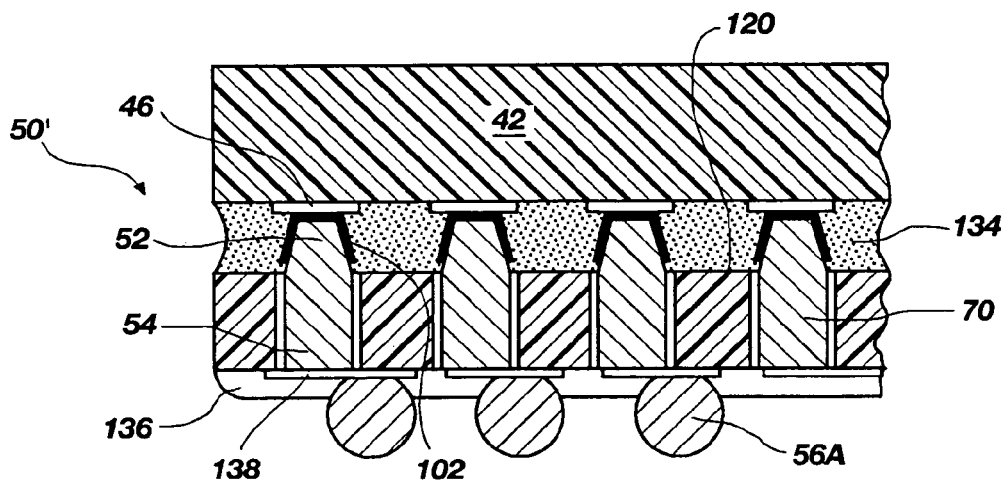
FIG. 21 is a cross-sectional side view of a portion of a single package interconnect or interposer through which a plurality of vias is constructed in accordance with the present invention.

Illustrated in drawing FIG. 21 is a single package application of the invention in which bond pads 46 of a semiconductor die 42 are directly joined to conductive via ends 52, which may comprise a metal or alloy, of a substrate 60 of a package interconnect or interposer 50'. The opposed ends 54 of the vias 70 are connected to metallization traces 138, the distal ends of which are connected to discrete conductive elements in the form of, for example, solder balls 56A, for attachment to terminals of a circuit board or the like. Substantially flat end surfaces of via ends 52 are shown with a metal overlay 102 to enhance contact with bond pads 46, metal overlay 102 extending down a portion of the sides of via ends 52. An insulating dielectric material 134 is placed in the space between the semiconductor die 42 and package interconnect or interposer 50'. In addition, a polymeric packaging layer 136 is shown surrounding the external balls/bumps 56A.

Figure 22:
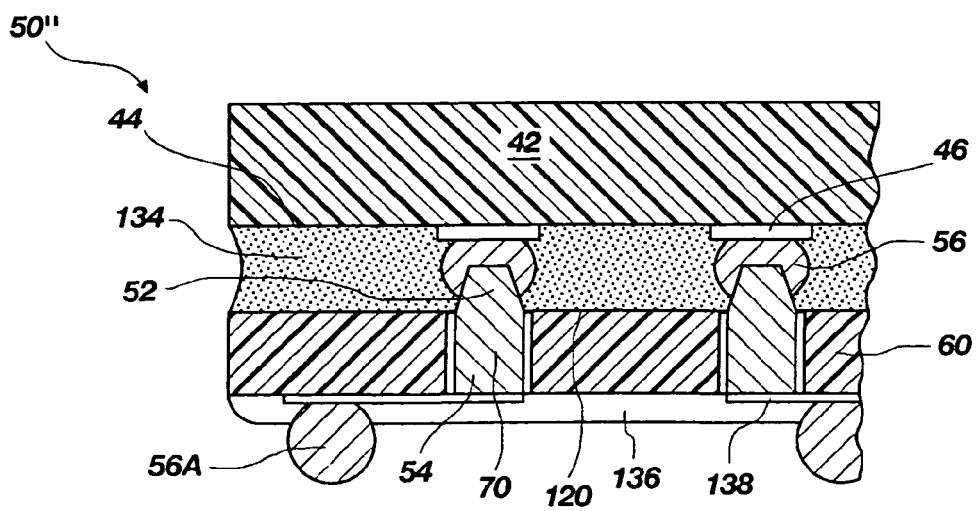
FIG. 22 is a cross-sectional side view of a portion of another single package interconnect or interposer through which a plurality of vias is constructed in accordance with the present invention.

Illustrated in drawing FIG. 22, another form of a single package interconnect or interposer 50" is shown which differs from the embodiment of the invention illustrated in drawing FIG. 21 in that the die bond pads 46 are connected to the via ends 52 through discrete conductive elements in the form of solder balls/bumps 56. Like the package interconnect 50' illustrated in drawing FIG. 21, discrete conductive elements in the form of external solder balls/bumps 56A are connected to via ends 54 by metallization traces 138.

Figure 23:
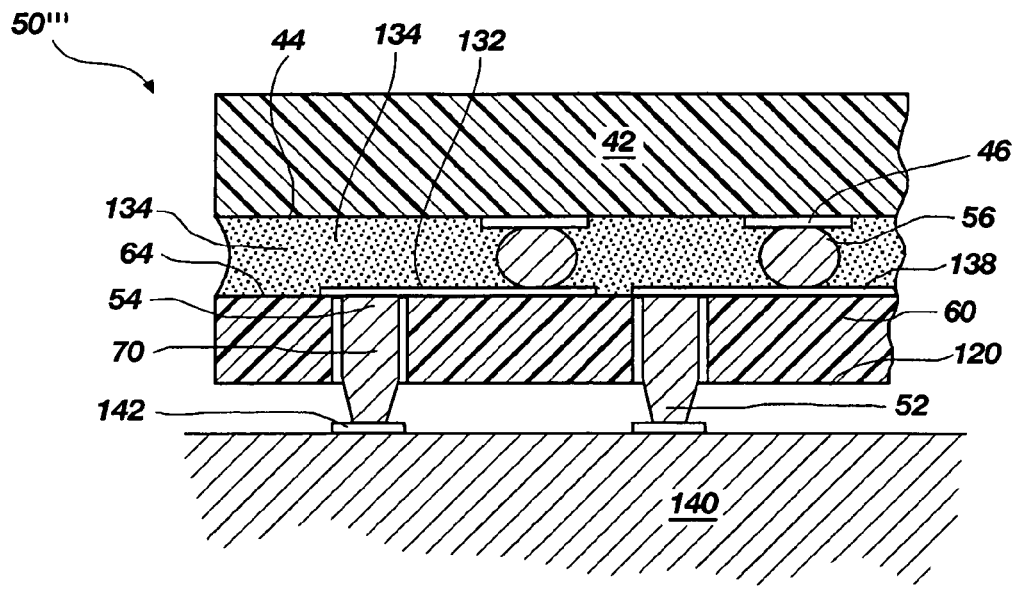
FIG. 23 is a cross-sectional side view of a portion of a further embodiment of a single package interconnect or interposer through which a plurality of vias is constructed in accordance with the present invention.

A further variation of single package interconnect or interposer 50''' is illustrated in drawing FIG. 23, having a substrate 60 with vias 70 passing therethrough. First via ends 52 are frustoconical or trapezoidal in shape, i.e. are mesa-shaped, as prepared by the method of this invention, and are shown directly impinging on contact sites 142 on a circuit board or other carrier substrate 140. The second surface 64 of the substrate 60 is shown as being unthinned, whereby only the end surface 132 of each via 70 is accessible for metallization traces 138. Discrete conductive elements in the form of solder balls or bumps 56 are bonded to the metallization traces 138 and bond pads 46 on the active surface 44 of semiconductor die 42. As shown, a dielectric material 134 may be disposed in the volume between semiconductor die 42 and interposer 50'''.

Figure 24:
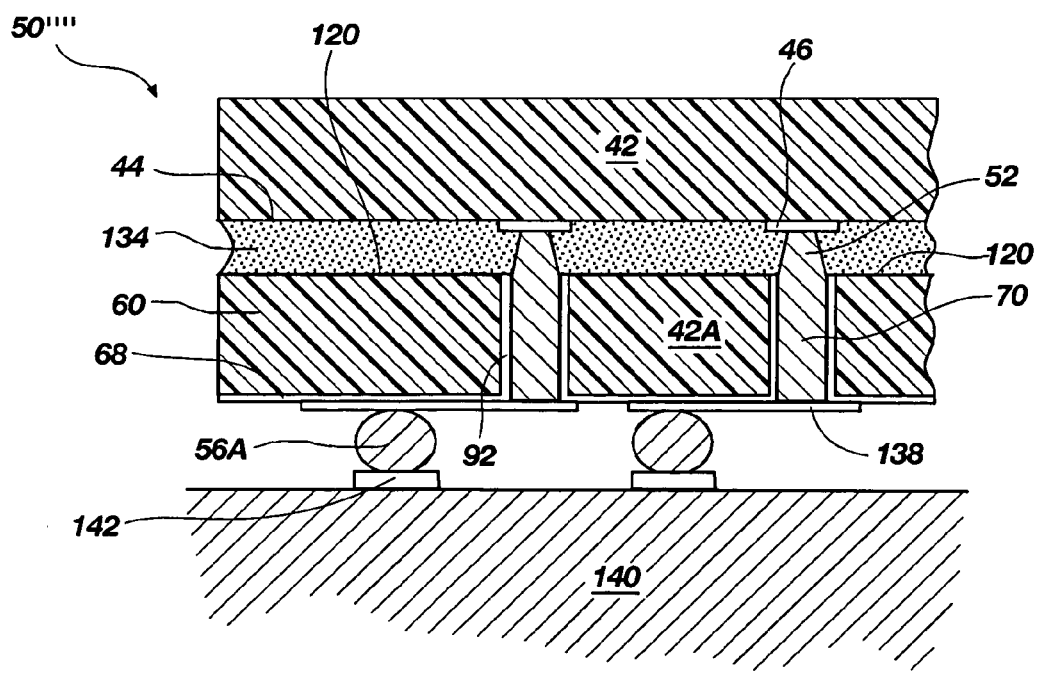
FIG. 24 is a cross-sectional side view of a portion of a multiple-die interposer/interconnect having a plurality of vias constructed in accordance with the present invention.

Another use of TWIs or vias 70 of the invention is illustrated in drawing FIG. 24, wherein the vias 70 pass through non-active regions of a second semiconductor die 42A, connecting bond pads of a first semiconductor die 42 to conductive sites 142 on a circuit board 140. The substrate 60 identified as a second semiconductor die 42A may, alternatively, comprise an interconnect substrate or interposer 50''''. The interconnect substrate or interposer 50'''' is shown in this embodiment as being inverted, when compared to the embodiment of the invention illustrated in drawing FIG. 23. Thus, first via ends 52 (frustoconical or trapezoidal) are shown as being in contact for temporary electrical connection to a semiconductor die 42 in a full-wafer or partial-wafer stage. Second via ends 54 are in contact with metallization traces 138. As illustrated in drawing FIG. 23, the volume between semiconductor die 42 and substrate 60 is shown as having been filled with a dielectric material 134.

Figure 25:
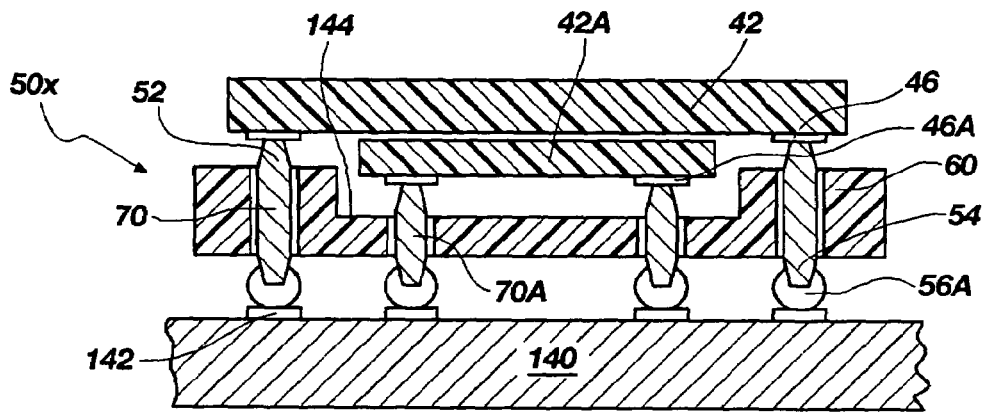
FIG. 25 is a cross-sectional side view of a portion of another multiple-die interposer/interconnect having a plurality of vias constructed in accordance with the present invention.
Figure 26:
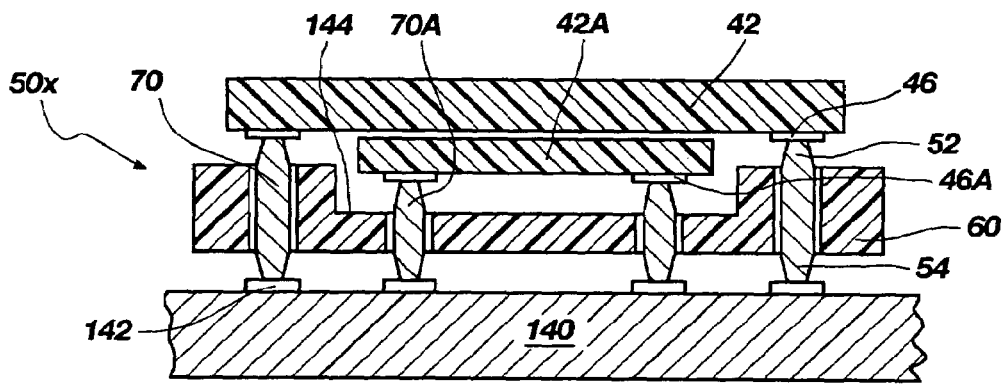
FIG. 26 is a cross-sectional side view of a portion of an additional multiple-die interposer/interconnect having a plurality of vias constructed in accordance with the present invention.
Figure 27:
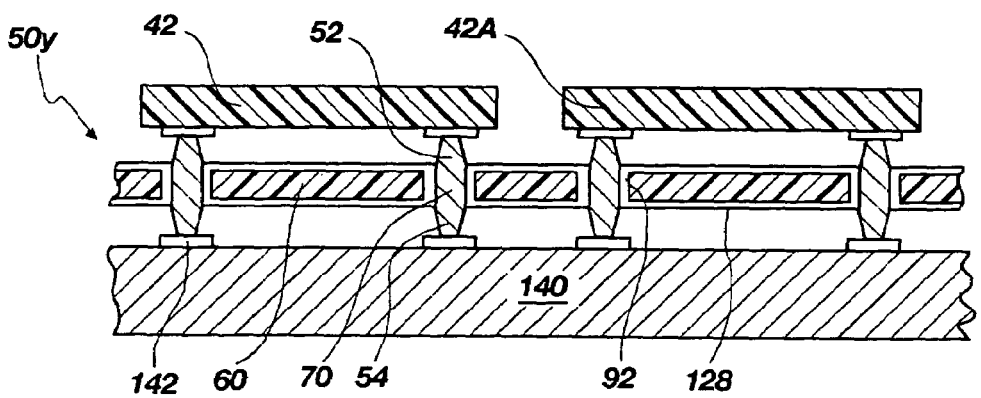
FIG. 27 is a cross-sectional side view of a portion of a further embodiment of a multiple-die interposer/interconnect having a plurality of vias constructed in accordance with the invention.

Illustrated in drawing FIGS. 25, 26 and 27 are three exemplary configurations of a multi-die interconnect or interposer 50x, and 50y, respectively, for connecting a first semiconductor die 42 and a second semiconductor die 42A to a carrier substrate 140 such as a circuit board, etc. In FIGS. 25 and 26, a multi-level interconnect 50x has a further thinned, recessed region 144 for accommodating a second semiconductor die 42A. Vias 70 and 70A are provided for respective connection to bond pads 46 of the first semiconductor die 42 and bond pads 46A of the second semiconductor die 42A, and for direct connection or (as shown) discrete conductive element connection in the form of solder balls/bumps 56A to a carrier substrate 140 such as a circuit board. The via ends 52, 54 are uniformly shown as having the trapezoidal or frustoconical shapes. Optionally, some of the via ends 52, 54 may be of the flared or post configuration as described previously. In drawing FIGS. 25 and 26, the semiconductor dice 42, 42A are superimposed or "stacked," while in drawing FIG. 27, the semiconductor dice 42, 42A are arranged to be substantially coplanar on interconnect 50y. In each of these embodiments, additional semiconductor dice may be accommodated by additional stacking or co-planar additions.

Other applications of an interconnect or interposer are contemplated, by use of variations in via end configurations, die orientation, numbers of dice, and the like.

The methods presented herein enable a small via aperture diameter to be formed, with a small pitch (spacing), high precision alignment and high resolution of features. Solder connections may be readily formed at dimensions smaller than currently used. It is believed that the invention enables the use of die bond pads as small as about 2×2 microns.

Although the foregoing description contains many specifics, these should not be construed as limiting the scope of the present invention, but merely as providing illustrations of some of the presently preferred embodiments. Similarly, other embodiments of the invention may be devised which do not depart from the spirit or scope of the present invention. Moreover, features from different embodiments of the invention may be employed in combination. The scope of the invention is, therefore, indicated and limited only by the appended claims and their legal equivalents, rather than by the foregoing description. All additions, deletions, and modifications to the invention, as disclosed herein, which fall within the meaning and scope of the claims are to be embraced thereby.

What is claimed is:

1. A method for forming a conductive via through a substrate comprising:
   providing a substrate having an upper surface and a lower surface and having a layer of etch mask material on one of the upper surface and the lower surface;
   forming an aperture passing through the substrate between the upper and lower surfaces;
   contacting the aperture with an etchant to enlarge the aperture, the enlarged aperture tapering from a larger size in an interior of the substrate to a lesser size at one of the upper surface and the lower surface of the substrate;
   applying a passivating material to an interior surface of the enlarged aperture;
   forming a conductive member having upper and lower ends within the passivated, enlarged aperture; and
   thinning the substrate from at least one of the upper and lower surfaces to expose at least one end portion of the conductive member.

2. The method in accordance with claim 1, wherein the substrate comprises a semiconductive material.

3. The method in accordance with claim 2, wherein the substrate comprises one of silicon, gallium arsenide, germanium, indium phosphide, and a silicon-on-insulator (SOI) type substrate.

4. The method in accordance with claim 1, wherein the mask layer of etch material comprises at least one of silicon dioxide and silicon nitride.

5. The method in accordance with claim 1, wherein the aperture is formed by laser drilling.

6. The method in accordance with claim 1, wherein the enlarged aperture is formed by etching with a dry etchant.

7. The method in accordance with claim 1, wherein the enlarged aperture is formed to include a portion with a diameter which is substantially uniform.

8. The method in accordance with claim 1, wherein the enlarged aperture is formed to have an end exhibiting one of a trapezoidal shape and a frustoconical shape.

9. The method in accordance with claim 1, wherein the enlarged aperture increases in size with distance from the etch mask material layer.

10. The method in accordance with claim 1, wherein the etchant comprises an aqueous solution of tetramethyl ammonium hydroxide (TMAH).

11. The method in accordance with claim 1, wherein the etchant comprises tetramethyl ammonium hydroxide (TMAH) in a glycol and deionized water.

12. The method in accordance with claim 1, wherein a transverse cross-section of the enlarged aperture is generally square, and further comprising forming a rounded cross-section thereof.

13. The method in accordance with claim 12, comprising contacting the surfaces of the enlarged aperture with a wet etchant for isotropic enlargement thereof.

14. The method in accordance with claim 13, wherein the wet etchant comprises a mixture of ammonium fluoride, phosphoric acid, deionized water and hydrogen peroxide.

15. The method in accordance with claim 12, comprising contacting the surfaces of the enlarged aperture with a dry etchant for isotropic enlargement thereof.

16. The method in accordance with claim 15, wherein the dry etchant comprises at least one of hydrobromic acid (HBr) and hydrobromo acid (HBrO2SF6).

17. The method in accordance with claim 1, wherein the interior surface of the enlarged aperture is passivated by forming a layer of electrically passivating material thereon.

18. The method in accordance with claim 17, wherein the electrically passivating material comprises one of an oxide and a nitride.

19. The method in accordance with claim 17, wherein the electrically passivating material comprises an insulative polymer.

20. The method in accordance with claim 17, wherein the electrically passivating material is formed on the interior surface of the enlarged aperture by one of chemical vapor deposition (CVD) and plasma-enhanced chemical vapor deposition (PECVD).

21. The method in accordance with claim 1, wherein the conductive member is formed by filling the passivated, enlarged aperture with a filler comprising one of a metal, a metal-containing material, and a conductive polymer.

22. The method in accordance with claim 21, wherein the metal comprises at least one of tin, copper, nickel, silver, gold, tungsten, aluminum and alloys thereof.

23. The method in accordance with claim 1, wherein forming the conductive member includes a first act of lining the passivated, enlarged aperture with a metallic seed layer.

24. The method in accordance with claim 23, wherein the metallic seed layer is formed in the passivated, enlarged aperture by one of chemical vapor d eposition (CVD) and plasma-enhanced chemical vapor deposition (PECVD).

25. The method in accordance with claim 23, wherein forming the conductive member includes filling the seeded passivated, enlarged aperture with a conductive metal by electroless deposition.

26. The method in accordance with claim 23, wherein forming the conductive member includes filling the passivated, enlarged aperture with a metal by electroplating.

27. The method in accordance with claim 1, wherein forming the conductive member includes:
   closing off one end of the passivated, enlarged aperture with a conductive plate; and
   electroplating within the passivated, enlarged aperture from the conductive plate to fill the passivated, enlarged aperture with metal.

28. The method in accordance with claim 1, wherein forming the conductive member includes:
   filling the passivated, enlarged aperture with a conductor-containing polymeric material; and
   hardening the conductor-containing material to a conductive solid.

29. The method in accordance with claim 1, wherein thinning the substrate comprises thinning of substrate material to expose a portion of the conductive member as a conductive connection stud extending a desired stand-off distance from a surface of the substrate.

30. The method in accordance with claim 29, wherein the desired stand-off distance is selected for direct attachment to a bond pad of a semiconductor device.

31. The method in accordance with claim 30, wherein the desired stand-off distance is greater than about 300 µm.

32. The method in accordance with claim 1, wherein thinning the substrate comprises one of etching, abrasive grinding and chemical-mechanical-planarization (CMP).

33. The method in accordance with claim 1, further comprising applying at least one metallic layer to the exposed at least one end portion of the conductive member.

34. The method in accordance with claim 1, further comprising forming conductive projections on the exposed at least one end portion of the conductive member.

35. A method for forming a conductive via through a substrate, comprising:

providing a substrate having an upper surface and an opposed lower surface, wherein the upper surface is covered with a layer of mask material;

forming an opening in the layer of mask material;

etching an anisotropic precursor aperture in the substrate;

etching the anisotropic precursor aperture to a shape having an enlarged interior region tapering to a smaller opening proximate the layer of mask material;

passivating interior surfaces of the shaped aperture to form a passivated aperture;

filling the passivated aperture with a conductive material;

consolidating the conductive material to form a via; and thinning the substrate from the upper surface to expose a via end.

36. A method for forming a conductive via through a substrate, comprising:

providing a substrate having an upper surface and an opposed lower surface, wherein the upper surface is covered with a layer of mask material;

forming a lower precursor aperture portion in the opposed lower surface by isotropic etching, the lower precursor aperture having one of a pyramidal shape and a conical shape;

forming an opening in the layer of mask material;

etching an anisotropic upper precursor aperture portion through the opening and extending to the lower precursor aperture;

etching the upper precursor aperture portion to a shape having an enlarged interior region tapering to a smaller opening proximate the layer of mask material;

passivating interior surfaces of the upper shaped precursor aperture portion and the lower precursor aperture portion;

filling the passivated upper shaped and lower precursor aperture portions with a conductive material;

consolidating the conductive material to form a via having upper and lower ends; and thinning the substrate from the upper surface to expose the upper via end.

37. The method in accordance with claim 36, further comprising thinning the substrate from the oppposed lower surface to expose the lower end.

38. A method for forming a conductive via through a substrate, comprising:

providing a substrate having an upper surface and an opposed lower surface, wherein the upper surface is covered with a layer of mask material;

forming an upper precursor aperture portion partially through the substrate with a laser beam;

etching the upper precursor aperture portion to a shape having an enlarged interior region tapering to a smaller opening proximate the layer of mask material;

forming a conical precursor aperture portion into the opposed lower surface to meet the upper precursor aperture within the substrate;

passivating interior surfaces of the upper, shaped precursor aperture portion and the conical precursor aperture portion;

filling the upper, shaped precursor aperture portion and the conical precursor aperture portion with a conductive material;

consolidating the conductive material to form a via having upper and lower ends; and thinning the substrate from the upper surface to expose the upper via end.

39. The method in accordance with claim 38, further comprising thinning the substrate from the opposed lower surface to expose the lower via end.

40. A method for forming a conductive via through a substrate having an upper surface and a lower surface comprising:

forming a layer of etch mask material on one of the upper surface and the lower surface of the substrate;

forming an aperture passing through the substrate between the upper and lower surfaces;

contacting the aperture with an etchant to form an enlarged aperture, the enlarged aperture tapering from a larger size in an interior of the via in the substrate to a lesser size at one of the upper surface and the lower surface of the substrate;

applying a passivating material to an interior surface of the enlarged aperture;

forming a conductive member with upper and lower ends within the enlarged, passivated aperture; and thinning the substrate from at least one of the upper surface and the lower surface of the wafer to expose at least one end portion of the conductive member.

41. The method in accordance with claim 40, wherein the substrate comprises a semiconductive material.

42. The method in accordance with claim 41, wherein the substrate comprises one of silicon, gallium arsenide, germanium, indium phosphide, and a silicon-on-insulator (SOI) type substrate.

43. The method in accordance with claim 40, wherein the layer of etch mask material comprises at least one of silicon dioxide and silicon nitride.

44. The method in accordance with claim 40, wherein the aperture is formed by laser drilling.

45. The method in accordance with claim 40, wherein the enlarged aperture is formed by etching with a dry etchant.

46. The method in accordance with claim 40, wherein the enlarged aperture is formed with a portion having a lateral dimension which is substantially uniform.

47. The method in accordance with claim 40, wherein the enlarged aperture includes an end having one of a trapezoidal shape and a frustoconical shape.

48. The method in accordance with claim 40, wherein the enlarged aperture is enlarged by contact with the etchant forming an aperture progressively laterally enlarged as a distance from the layer of mask material increases.

49. The method in accordance with claim 40, wherein the etchant comprises an aqueous solution of tetramethyl ammonium hydroxide (TMAH).

50. The method in accordance with claim 40, wherein the etchant comprises tetramethyl ammonium hydroxide (TMAH) in a glycol and deionized water.

51. The method in accordance with claim 40, wherein a transverse cross-section of the enlarged aperture comprises a generally rounded cross-section.

52. The method in accordance with claim 51, comprising contacting of the enlarged aperture with a wet etchant for isotropic enlargement thereof to form the generally rounded cross-section.

53. The method in accordance with claim 52, wherein the wet etchant comprises a mixture of ammonium fluoride, phosphoric acid, deionized water and hydrogen peroxide.

54. The method in accordance with claim 51, comprising contacting surfaces of the enlarged aperture with a dry etchant for isotropic enlargement thereof to form the generally rounded cross-section.

55. The method in accordance with claim 54, wherein the dry etchant comprises at least one of hydrobromic acid (HBr) and hydrobromo acid ($HBrO_2SF_6$).

56. The method in accordance with claim 40, wherein the interior surface of the enlarged aperture is passivated by forming a layer of electrically passivating material thereon.

57. The method in accordance with claim 56, wherein the electrically passivating material comprises one of an oxide and a nitride.

58. The method in accordance with claim 56, wherein the electrically passivating material comprises an insulative polymer.

59. The method in accordance with claim 56, wherein the electrically passivating material is formed on the interior surface of the enlarged aperture by one of chemical vapor deposition (CVD) and plasma-enhanced chemical vapor deposition (PECVD).

60. The method in accordance with claim 40, wherein the conductive member is formed by filling the enlarged, passivated aperture with a filler comprising one of a metal, a metal-containing material, and a conductive polymer.

61. The method in accordance with claim 60, wherein the metal comprises at least one of copper, nickel, silver, gold, tin, tungsten, aluminum and alloys thereof.

62. The method in accordance with claim 40, wherein forming the conductive member includes lining the enlarged, passivated aperture with a metallic seed layer.

63. The method in accordance with claim 62, wherein the metallic seed layer is formed in the enlarged, passivated aperture by one of chemical vapor deposition (CVD) and plasma-enhanced chemical vapor deposition (PECVD).

64. The method in accordance with claim 62, wherein forming the conductive member includes filling the seeded enlarged, passivated aperture with a conductive metal by electroless deposition.

65. The method in accordance with claim 62, wherein forming the conductive member includes filling the enlarged, passivated aperture with a metal by electroplating.

66. The method in accordance with claim 40, wherein the forming a conductive member includes:
  closing off one end of the enlarged, passivated aperture with a conductive plate; and
  electroplating the interior surface of the enlarged, passivated aperture from the conductive plate to fill the enlarged, passivated aperture with metal.

67. The method in accordance with claim 40, wherein forming the conductive member includes:
  filling the enlarged, passivated aperture with a conductor-containing polymeric material; and
  hardening the conductor-containing material to a conductive solid.

68. The method in accordance with claim 40, wherein thinning the substrate comprises the thinning of a substrate material to expose the at least one end portion of the conductive member as a conductive connection stud extending beyond a surface of the substrate a desired stand-off distance.

69. The method in accordance with claim 68, wherein the desired stand-off distance is configured for direct attachment to a bond pad.

70. The method in accordance with claim 69, wherein the desired stand-off distance is greater than about 300 μm.

71. The method in accordance with claim 40, wherein the thinning comprises one of etching, physical abrasive grinding and a chemical-mechanical planarization (CMP).

72. The method in accordance with claim 40, further comprising applying at least one metallic layer to the at least one exposed end portion of the conductive member.

73. The method in accordance with claim 40, further comprising forming conductive projections on the at least one exposed end portion of the conductive member.

74. A method for forming a conductive via through a substrate having an upper surface and an opposed, lower surface, the upper surface covered with a layer of mask material, comprising:
  forming an opening in the layer of mask material;
  etching an anisotropic precursor aperture in the substrate;
  etching the anisotropic precursor aperture to form a shaped aperture having an enlarged interior region tapering to a smaller opening proximate the layer of mask material;
  passivating an interior surface of the shaped aperture to form a passivated aperture;
  filling the passivated aperture with a conductive material;
  consolidating the conductive material to form a via; and
  thinning the substrate from the upper surface to expose a via end.

75. A method for forming a conductive via through a substrate having an upper surface and an opposed, lower surface, the upper surface covered with a layer of mask material, comprising:
  forming a lower precursor aperture portion in the opposed, lower surface by isotropic etching, the lower precursor aperture portion having one of a pyramidal and a conical shape;
  forming an opening in the layer of mask material;
  etching an anisotropic upper precursor aperture portion through the opening and extending to the lower precursor aperture portion;
  etching the anisotropic upper precursor aperture portion to a shape having an enlarged interior region tapering to a smaller opening proximate the layer of mask material;
  passivating surfaces of the anisotropic upper and the lower precursor aperture portions to form a passivated aperture;
  filling the passivated aperture with a conductive material;
  consolidating the conductive material to form a via having upper and lower ends; and
  thinning the substrate from the upper surface to expose the upper via end.

76. The method in accordance with claim 75, further comprising thinning of the substrate from the lower surface to expose the lower via end.

77. A method for forming a conductive via through a substrate having an upper surface and an opposed, lower surface, the upper surface covered with a layer of mask material comprising:
  forming an upper precursor aperture portion partially through the substrate with a laser beam;
  etching the upper precursor aperture portion through a hole in the layer of mask material to a shape having an enlarged interior region tapering to a smaller opening proximate the layer of mask material;
  forming a lower, conical precursor aperture portion into the opposed, lower surface to meet the upper precursor aperture portion within the substrate;
  passivating interior surfaces of the upper and lower, conical precursor aperture portions to form a passivated aperture;

filling the passivated aperture with a conductive material;
consolidating the conductive material to form a via having upper and lower via ends and
thinning the substrate from the upper surface to expose the upper via end.

78. The method in accordance with claim 77, further comprising thinning the substrate from the lower surface to expose the lower via end.

* * * * *

UNITED STATES PATENT AND TRADEMARK OFFICE
CERTIFICATE OF CORRECTION

PATENT NO. : 7,109,068 B2  Page 1 of 1
APPLICATION NO. : 11/138544
DATED : September 19, 2006
INVENTOR(S) : Akram et al.

It is certified that error appears in the above-identified patent and that said Letters Patent is hereby corrected as shown below:

In column 15, line 28, in Claim 4, delete "mask layer of etch" and insert -- layer of etch mask --, therefor.

In column 15, line 64, in Claim 16, delete "(HBrO2SF6)." and insert -- $(HBrO_2SF_6)$. --, therefor.

In column 16, line 24, in Claim 24, delete "d eposition" and insert -- deposition --, therefor.

In column 16, line 59, in Claim 32, after "mechanical" delete "-".

In column 17, line 42, in Claim 37, delete "oppposed" and insert -- opposed --, therefor.

In column 18, line 58, in Claim 52, after "contacting" insert -- surfaces --.

Signed and Sealed this

Eighth Day of April, 2008

JON W. DUDAS
*Director of the United States Patent and Trademark Office*